United States Patent
Shimizu

(10) Patent No.: US 10,141,410 B2
(45) Date of Patent: Nov. 27, 2018

(54) SEMICONDUCTOR DEVICE, METHOD FOR MANUFACTURING SEMICONDUCTOR DEVICE, INVERTER CIRCUIT, DRIVING DEVICE, VEHICLE AND ELEVATOR

(71) Applicant: Kabushiki Kaisha Toshiba, Minato-ku (JP)

(72) Inventor: Tatsuo Shimizu, Shinagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/387,149

(22) Filed: Dec. 21, 2016

(65) Prior Publication Data

US 2017/0200787 A1    Jul. 13, 2017

(30) Foreign Application Priority Data

Jan. 12, 2016  (JP) ................. 2016-003643

(51) Int. Cl.
| | | |
|---|---|---|
| *H01L 29/36* | (2006.01) | |
| *H01L 29/16* | (2006.01) | |
| *H01L 21/02* | (2006.01) | |
| *H01L 21/324* | (2006.01) | |
| *H01L 29/47* | (2006.01) | |

(Continued)

(52) U.S. Cl.
CPC .... *H01L 29/1608* (2013.01); *H01L 21/02529* (2013.01); *H01L 21/324* (2013.01); *H01L 29/045* (2013.01); *H01L 29/0619* (2013.01); *H01L 29/167* (2013.01); *H01L 29/36* (2013.01); *H01L 29/47* (2013.01);

(Continued)

(58) Field of Classification Search
CPC ............ H01L 21/02529; H01L 21/324; H01L 29/045; H01L 29/0619; H01L 29/1608; H01L 29/167; H01L 29/36; H01L 29/47; H01L 29/6606; H01L 29/66143; H01L 29/872

See application file for complete search history.

(56) References Cited

U.S. PATENT DOCUMENTS

| | | | |
|---|---|---|---|
| 2008/0233285 A1* | 9/2008 | Das ................... | H01L 21/02236 427/248.1 |
| 2010/0244049 A1 | 9/2010 | Yamamoto et al. | |

(Continued)

FOREIGN PATENT DOCUMENTS

| | | |
|---|---|---|
| JP | 2010-225877 | 10/2010 |
| JP | 5453867 | 3/2014 |

(Continued)

OTHER PUBLICATIONS

Koutarou Kawahara, et al., "Detection and depth analyses of deep levels generated by ion implantation in n- and p-type 4H-SiC", Journal of Applied Physics, 106(1), http://hdl.handle.net/2433/109895, Jul. 2009, 7 pages.

(Continued)

*Primary Examiner* — Joseph Galvin, III
(74) *Attorney, Agent, or Firm* — Oblon, McClelland, Maier & Neustadt, L.L.P.

(57) ABSTRACT

A semiconductor device according to an embodiment includes an n-type SiC region, an electrode in contact with the SiC region, and a region including oxygen, the region provided in the SiC region, the region being provided on an electrode side of the SiC region.

13 Claims, 22 Drawing Sheets

(51) Int. Cl.
  *H01L 29/66* (2006.01)
  *H01L 29/872* (2006.01)
  *H01L 29/04* (2006.01)
  *H01L 29/06* (2006.01)
  *H01L 29/167* (2006.01)

(52) U.S. Cl.
  CPC .... *H01L 29/6606* (2013.01); *H01L 29/66143* (2013.01); *H01L 29/872* (2013.01)

(56) References Cited

U.S. PATENT DOCUMENTS

| | | | | |
|---|---|---|---|---|
| 2013/0055052 | A1* | 2/2013 | Kaeriyama | H03K 17/0828 714/799 |
| 2013/0328062 | A1* | 12/2013 | Hisamoto | H01L 29/78 257/77 |
| 2015/0303271 | A1* | 10/2015 | Tanaka | H01L 29/78 257/77 |
| 2016/0087043 | A1 | 3/2016 | Shimizu | |
| 2016/0087045 | A1* | 3/2016 | Shimizu | H01L 21/049 257/77 |
| 2016/0190250 | A1* | 6/2016 | Kwok | H01L 29/0847 257/77 |

FOREIGN PATENT DOCUMENTS

| | | |
|---|---|---|
| JP | 5738376 | 6/2015 |
| JP | 2016-63110 | 4/2016 |
| JP | 2016-63111 | 4/2016 |

OTHER PUBLICATIONS

Satoshi Tanimoto, et al., "Toward a better understanding of Ni-based ohmic contacts on SiC", Materials Science Forum, ISSN: 1662-9752, vols. 679-680, doi:10.4028/www.scientific.net/MSF.679-680.465, Mar. 28, 2011, 4 pages.

S. Tanimoto, et al., "Toward a better understanding of Ni2Si-based contact on SiC", ECSCRM2010 abstract, 2010, pp. 1.

* cited by examiner

SEMICONDUCTOR DEVICE, METHOD FOR MANUFACTURING SEMICONDUCTOR DEVICE, INVERTER CIRCUIT, DRIVING DEVICE, VEHICLE AND ELEVATOR

CROSS-REFERENCE TO RELATED APPLICATION

This application is based upon and claims the benefit of priority from Japanese Patent Application No. 2016-003643, filed on Jan. 12, 2016, the entire contents of which are incorporated herein by reference.

FIELD

Embodiments described herein relate generally to a semiconductor device, a method for manufacturing a semiconductor device, an inverter circuit, a driving device, a vehicle, and an elevator.

BACKGROUND

Silicon carbonate (SiC) is expected to be used as a material for a next-generation semiconductor device. SiC has better physical properties than silicon (Si). For example, the bandgap of SiC is three times more than that of Si, the breakdown field strength of SiC is about ten times more than that of Si, and the thermal conductivity of SiC is about three times more than that of Si. These characteristics are used to achieve a semiconductor device which has low loss and can operate at a high temperature.

When the height of a Schottky barrier between an n-type SiC region and an electrode including metal varies, the characteristics of a semiconductor device vary. It is preferable to achieve a semiconductor device in which a variation in the height of the Schottky barrier is reduced.

DETAILED DESCRIPTION

Figure 1:
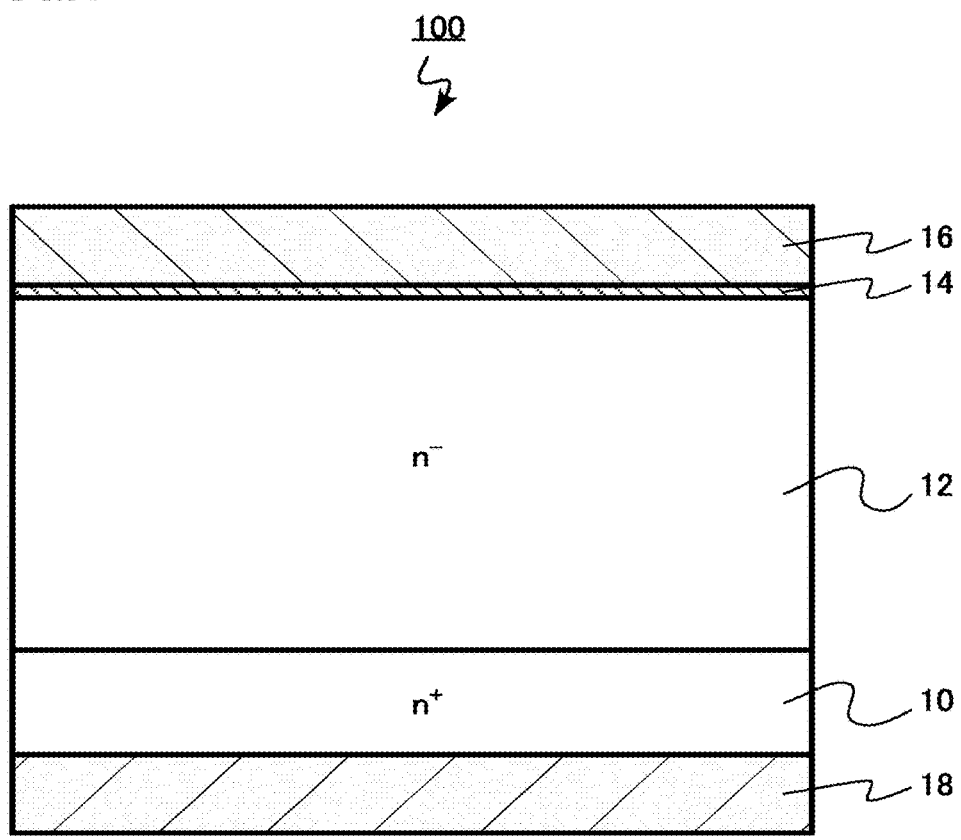
FIG. 1 is a cross-sectional view schematically illustrating a semiconductor device according to a first embodiment.

A semiconductor device according to an embodiment includes an n-type SiC region, an electrode in contact with the SiC region, and a region including oxygen, the region provided in the SiC region, the region being provided on an electrode side of the SiC region.

Hereinafter, embodiments of the invention will be described with reference to the drawings. In the following description, the same or similar members are denoted by the same reference numerals and the description thereof will not be repeated.

In the following description, $n^+$, n, $n^-$, $p^+$, p, and $p^-$ indicate the relative levels of impurity concentration in each conductivity type. That is, $n^+$ indicates an n-type impurity concentration which is higher than that of n and $n^-$ indicates an n-type impurity concentration which is lower than that of n. In addition, $p^+$ indicates a p-type impurity concentration which is higher than that of p and $p^-$ indicates a p-type impurity concentration which is lower than that of p. In some cases, an $n^+$ type and an $n^-$ type are simply referred to as an n type and a $p^+$ type and a $p^-$ type are simply referred to as a p type.

First Embodiment

A semiconductor device according to this embodiment includes an n-type SiC region, an electrode that comes into contact with the SiC region, and a region that includes oxygen and is provided in the SiC region so as to be close to the electrode.

FIG. 1 is a cross-sectional view schematically illustrating the structure of a Schottky barrier diode (SBD) which is the semiconductor device according to this embodiment.

An SBD 100 includes an n+ SiC substrate 10, an n− drift region (SiC region) 12, an oxygen region (region) 14, an anode electrode (electrode) 16, and a cathode electrode 18.

The n+ SiC substrate 10 is a 4H—SiC substrate having, for example, N (nitrogen) as n-type impurities. The concentration of the n-type impurities is, for example, equal to or greater than $1 \times 10^{18}$ cm$^{-3}$ and equal to or less than $1 \times 10^{21}$ cm$^{-3}$.

Figure 2:
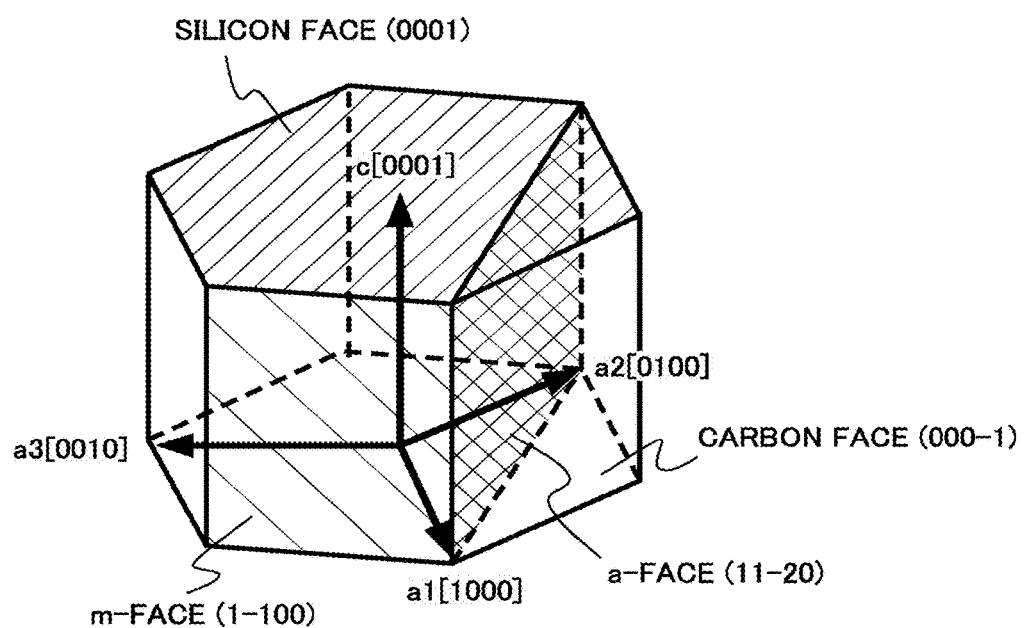
FIG. 2 is a diagram illustrating the crystal structure of a SiC semiconductor according to the first embodiment.

FIG. 2 is a diagram illustrating the crystal structure of a SiC semiconductor. The representative crystal structure of the SiC semiconductor is a hexagonal crystal system such as 4H—SiC. One of the faces (the top faces of a hexagonal cylinder) which are normal to the c-axis along the axial direction of the hexagonal cylinder is a (0001) face. The (0001) face is referred to as a silicon face. Silicon (Si) is arranged on the silicon face.

The other face of the faces (the top faces of the hexagonal cylinder) which are normal to the c-axis along the axial direction of the hexagonal cylinder is a (000-1) face. The (000-1) face is referred to as a carbon face. Carbon (C) is arranged on the carbon face.

Aside face (cylindrical face) of the hexagonal cylinder is an m-face which is equivalent to a (1-100) face, that is, a {1-100} face. A face passing through a pair of ridge lines which are not adjacent to each other is an a-face which is equivalent to a (11-20) face, that is, a {11-20} face. Both silicon (Si) and carbon (C) are arranged on the m-face and the a-face, respectively.

Next, an example in which a front surface (upper surface) of the SiC substrate 10 is inclined at an angle that is equal to or greater than 0 degrees and equal to or less than 8 degrees with respect to the silicon face and a rear surface (lower surface) thereof is inclined at an angle that is equal to or greater than 0 degrees and equal to or less than 8 degrees with respect to the carbon face will be described. The surface which is inclined at an angle that is equal to or greater than 0 degrees and equal to or less than 8 degrees with respect to the silicon face and the surface which is inclined at an angle that is equal to or greater than 0 degrees and equal to or less than 8 degrees with respect to the carbon face can be regarded to be substantially the same as the silicon face and the carbon face in terms of characteristics.

The n− drift region 12 is, for example, a SiC epitaxial growth layer that is formed on the SiC substrate 10 by epitaxial growth. The n-type impurity concentration of the drift region 12 is, for example, equal to or greater than $5 \times 10^{15}$ cm$^{-3}$ and equal to or less than $5 \times 10^{16}$ cm$^{-3}$.

A surface of the drift region 12 is inclined at an angle that is equal to or greater than 0 degrees and equal to or less than 8 degrees with respect to the silicon face. The thickness of the drift region 12 is, for example, equal to or greater than 5 μm and equal to or less than 150 μm.

The anode electrode 16 including metal is provided on the drift region 12. The anode electrode 16 comes into contact with the drift region 12. The drift region 12 is electrically connected to the anode electrode 16.

The metal included in the anode electrode 16 is, for example, nickel (Ni), titanium (Ti), or molybdenum (Mo). The anode electrode 16 may be a single metal film or a stacked structure of a plurality of metal films. In addition, the anode electrode 16 may be made of an alloy of a plurality of metal materials. The anode electrode 16 may include a metal semiconductor compound such as metal silicide or metal carbide. The oxygen concentration of the metal forming the anode electrode 16 is less than $1 \times 10^{16}$ cm$^{-3}$.

The oxygen region (region) 14 including oxygen is provided in the drift region 12 so as to be close to the anode electrode 16. The oxygen region (region) 14 is provided on an anode electrode 16 side of the drift region 12. The oxygen concentration of the oxygen region 14 is, for example, equal to or greater than $1 \times 10^{16}$ cm$^{-3}$ and equal to or less than $1 \times 10^{21}$ cm$^{-3}$. In addition, the oxygen concentration of the oxygen region 14 is, for example, equal to or greater than $1 \times 10^{17}$ cm$^{-3}$ and equal to or less than $1 \times 10^{20}$ cm$^{-3}$. The oxygen concentration of the oxygen region 14 is typified by, for example, the maximum oxygen concentration of the oxygen region 14. The oxygen concentration of the oxygen region 14 is, for example, the maximum value of the measured oxygen concentration.

The oxygen region 14 is a SiC region including oxygen. The oxygen region 14 has a structure in which two oxygen atoms substitute one carbon atom in a SiC lattice. The carbon vacancy density of the oxygen region 14 is reduced by the above-mentioned structure. The above-mentioned structure causes a Si—O—Si bond to be present in the oxygen region 14.

Figure 3:
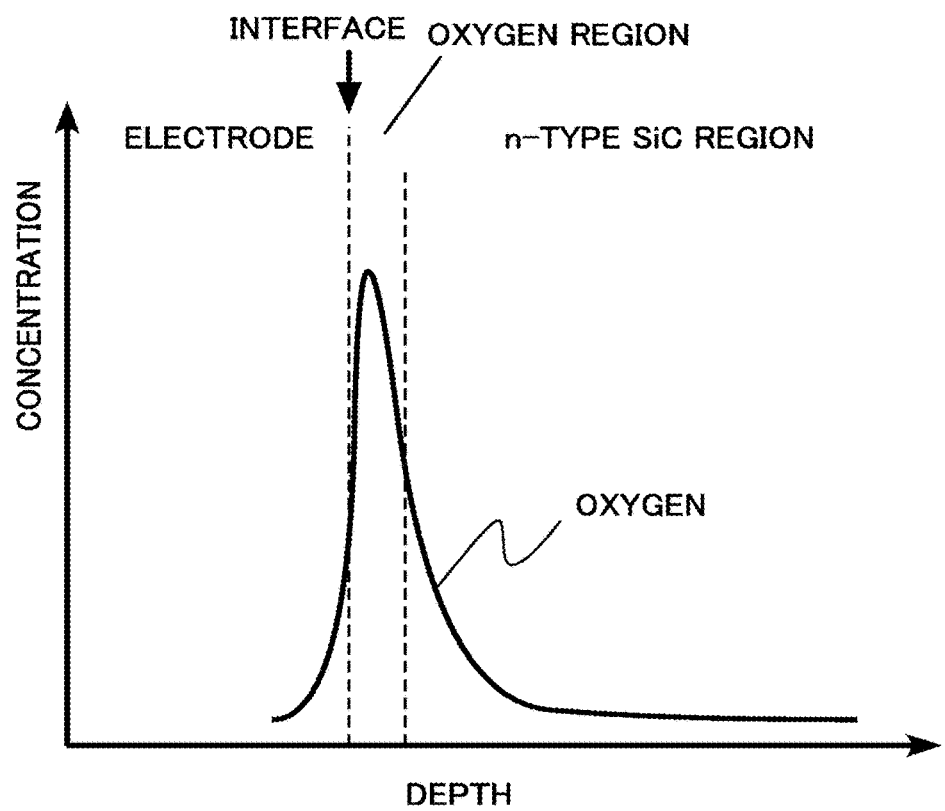
FIG. 3 is a diagram illustrating the profile of elements of the semiconductor device according to the first embodiment.

FIG. 3 is a diagram illustrating the profile of elements of the semiconductor device according to this embodiment. FIG. 3 shows the concentration distribution of oxygen in a cross section including the n− drift region (n-type SiC region) 12 and the anode electrode (electrode) 16.

As shown in FIG. 3, the peak of the concentration distribution of oxygen is located close to the drift region 12 at the interface between the drift region 12 and the anode electrode 16. A region including the peak is the oxygen region 14.

The cathode electrode 18 including metal is provided on a surface of the SiC substrate 10 which is opposite to the drift region 12. The drift region 12 is interposed between the cathode electrode 18 and the anode electrode 16. The cathode electrode 18 comes into contact with the SiC substrate 10. The cathode electrode 18 is electrically connected to the drift region 12.

The metal included in the cathode electrode 18 is, for example, nickel (Ni) or aluminum (Al). The cathode electrode 18 may be a single metal film or a stacked structure of a plurality of metal films. In addition, the cathode electrode 18 may be made of an alloy of a plurality of metal materials. The cathode electrode 18 may include a metal semiconductor compound.

Next, a method for manufacturing the semiconductor device according to this embodiment will be described. In the method for manufacturing the semiconductor device according to this embodiment, a heat treatment is performed in an atmosphere including oxygen under the condition that the amount of oxidation of SiC is less than 1 nm to form a region including oxygen in an n-type SiC region. After the region is formed, an electrode including metal is formed on the SiC region. The method for manufacturing the semiconductor device according to this embodiment is an example of a method for manufacturing the semiconductor device shown in FIG. 1.

Figure 4:
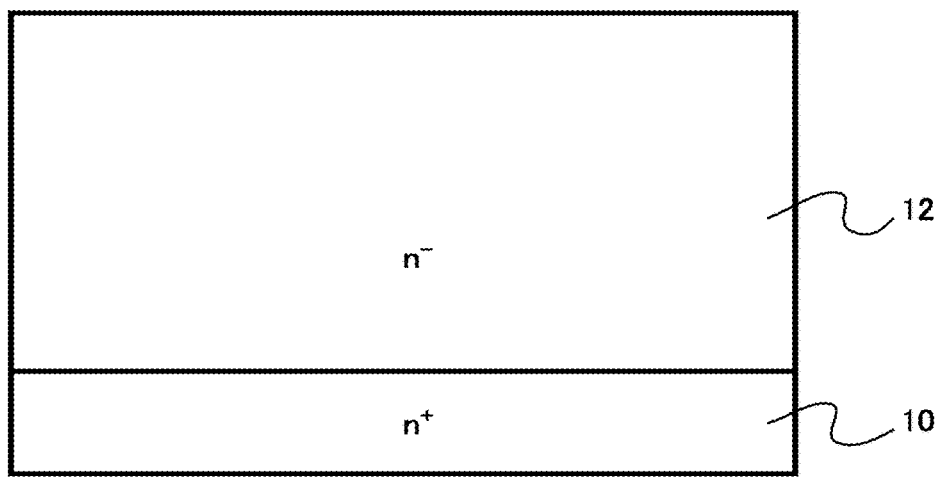
FIG. 4 is a cross-sectional view schematically illustrating a semiconductor device manufacturing method according to the first embodiment.
Figure 5:
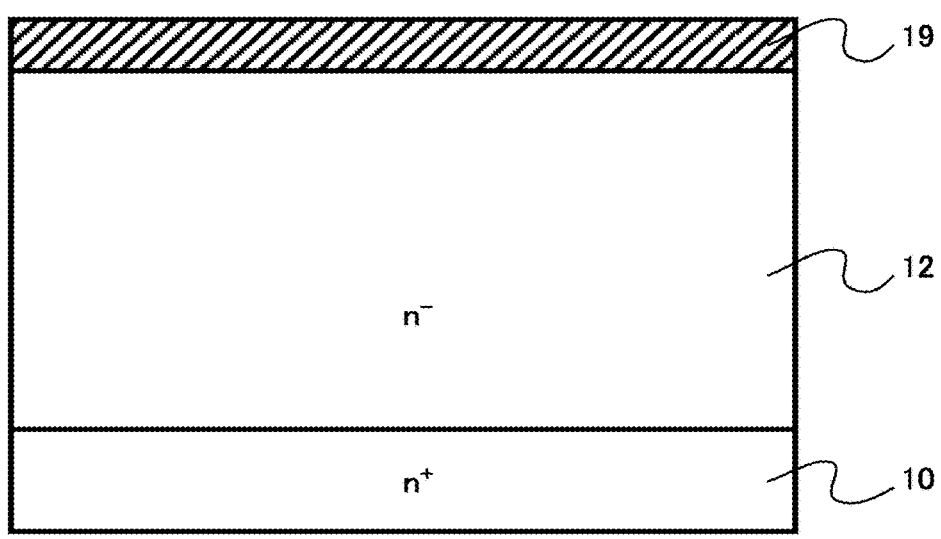
FIG. 5 is a cross-sectional view schematically illustrating the semiconductor device manufacturing method according to the first embodiment.
Figure 6:
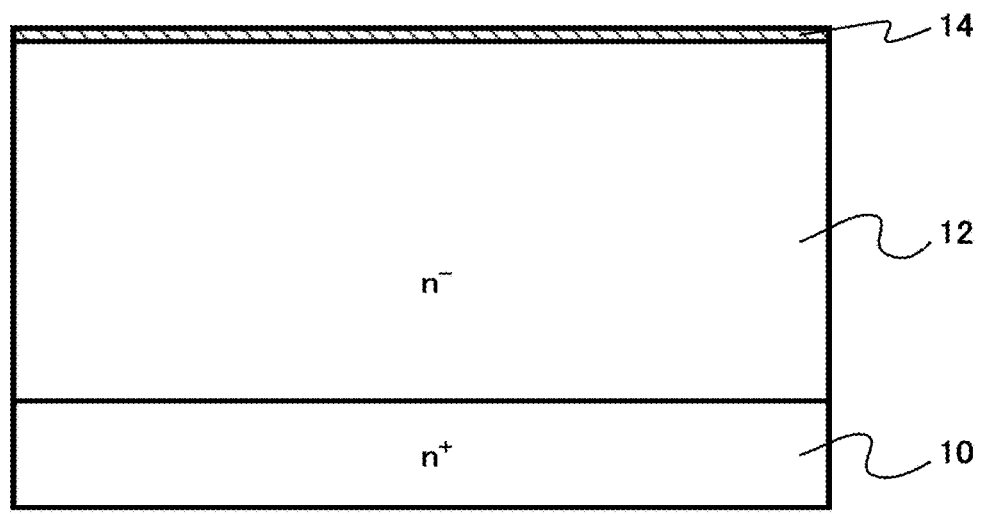
FIG. 6 is a cross-sectional view schematically illustrating the semiconductor device manufacturing method according to the first embodiment.

FIGS. 4 to 6 are cross-sectional views schematically illustrating the semiconductor device which is being manufactured in the semiconductor device manufacturing method according to this embodiment.

First, the n+ SiC substrate 10 having a front surface which is inclined at an angle that is equal to or greater than 0 degrees and equal to or less than 8 degrees with respect to the silicon face and a rear surface which is inclined at an angle that is equal to or greater than 0 degrees and equal to or less than 8 degrees with respect to the carbon face is prepared. Then, the n⁻ drift region 12 is formed on the front surface of the SiC substrate 10 by an epitaxial growth method (FIG. 4). A surface of the drift region 12 is also inclined at an angle that is equal to or greater than 0 degrees and equal to or less than 8 degrees with respect to the silicon face.

Then, a thermally oxidized film 19 is formed on the drift region 12 by thermal oxidation (FIG. 5). The thermal oxidation is performed in, for example, an oxidizing atmosphere at a temperature that is equal to or more than 1200° C. and equal to or less than 1500° C.

Then, the thermally oxidized film 19 is removed. The thermally oxidized film 19 is removed by, for example, hydrofluoric acid-based wet etching.

Then, a heat treatment is performed in an atmosphere including oxygen under the condition that the amount of oxidation of SiC is less than 1 nm to form the oxygen region 14 in the drift region 12 (FIG. 6). For example, during the heat treatment, a test wafer for a SiC wafer can be put into a heat treatment furnace to monitor the amount of oxidation of SiC during the heat treatment.

The oxygen region 14 is formed in the surface of the drift region 12. The oxygen in the drift region 12 is diffused by the heat treatment and the oxygen region 14 is formed.

The "condition that the amount of oxidation of SiC is less than 1 nm" during the heat treatment is the condition that SiC is not substantially oxidized. The heat treatment is performed at a temperature that is, for example, equal to or more than 300° C. and equal to or less than 900° C.

Then, the anode electrode 16 including metal is formed on the oxygen region 14 by a known process. In addition, the cathode electrode 18 including metal is formed on the rear surface of the SiC substrate 10. In this way, the SBD 100 according to this embodiment shown in FIG. 1 is manufactured.

Next, the function and effect of the semiconductor device and the semiconductor device manufacturing method according to this embodiment will be described.

Figure 7A:
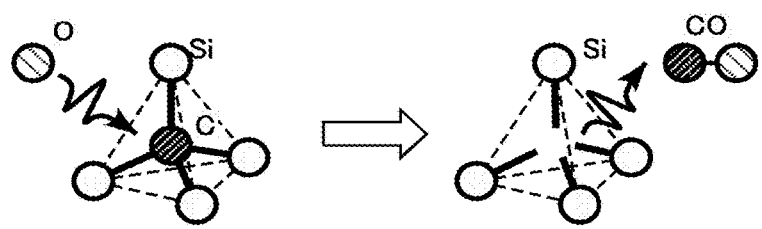
FIGS. 7A, 7B, and 7C are diagrams illustrating the function of the semiconductor device and the semiconductor device manufacturing method according to the first embodiment.
Figure 7B:
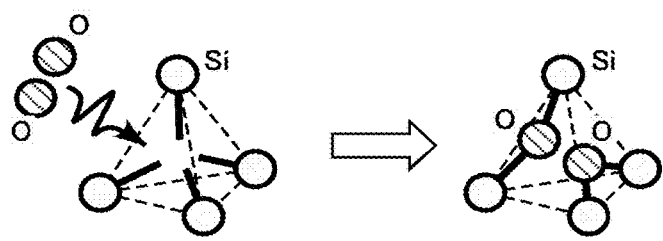
Figure 7C:
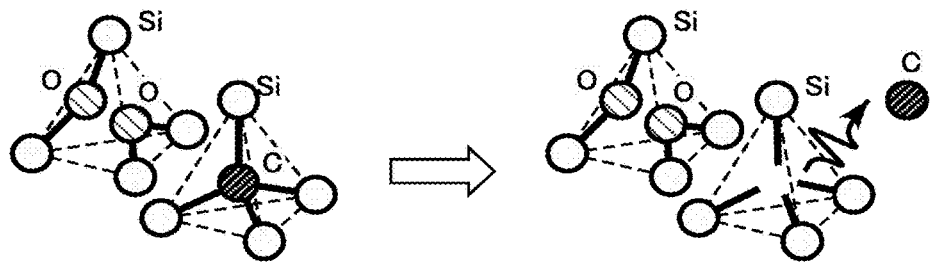

FIGS. 7A, 7B, and 7C are diagrams illustrating the function of the semiconductor device and the semiconductor device manufacturing method according to this embodiment. FIGS. 7A, 7B, and 7C show a carbon vacancy formation mechanism when SiC is oxidized on the basis of first principle calculation.

When oxygen (O) is supplied into SiC from a SiC surface, oxygen and carbon (C) in a SiC lattice are bonded to generate carbon monoxide (CO). As a result, a carbon vacancy is formed (FIG. 7A). The carbon vacancy formation mechanism is referred to as a first carbon vacancy formation mode.

Then, it has been found by the first principle calculation that, when a carbon vacancy and two oxygen atoms coexist, a structure in which the carbon vacancy is substituted with two oxygen atoms is energetically stabilized in terms of energy (FIG. 7B). The Si—O—Si bond is formed in the SiC lattice. Since the carbon vacancy is substituted with two oxygen atoms, a high energy gain of 8.2 eV is obtained.

The structure shown in FIG. 7B is energetically stable. However, for example, in a case in which SiC is oxidized at a high temperature, distortion occurs around the structure in which two oxygen atoms are present in SiC since the structure has a large volume. In order to remove the distortion, carbon atoms in the SiC lattices are emitted from the lattices and become interstitial carbon atoms. As a result, a carbon vacancy is formed (FIG. 7C). This carbon vacancy formation mechanism is referred to as a second carbon vacancy formation mode.

It has been found that, when SiC is oxidized to form an oxide film, a carbon vacancy is formed in SiC immediately below the oxide film by two modes, that is, the first carbon vacancy formation mode and the second carbon vacancy formation mode.

Figure 8A:
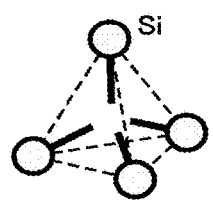
FIGS. 8A and 8B are diagrams illustrating the function of the semiconductor device and the semiconductor device manufacturing method according to the first embodiment.
Figure 8A:
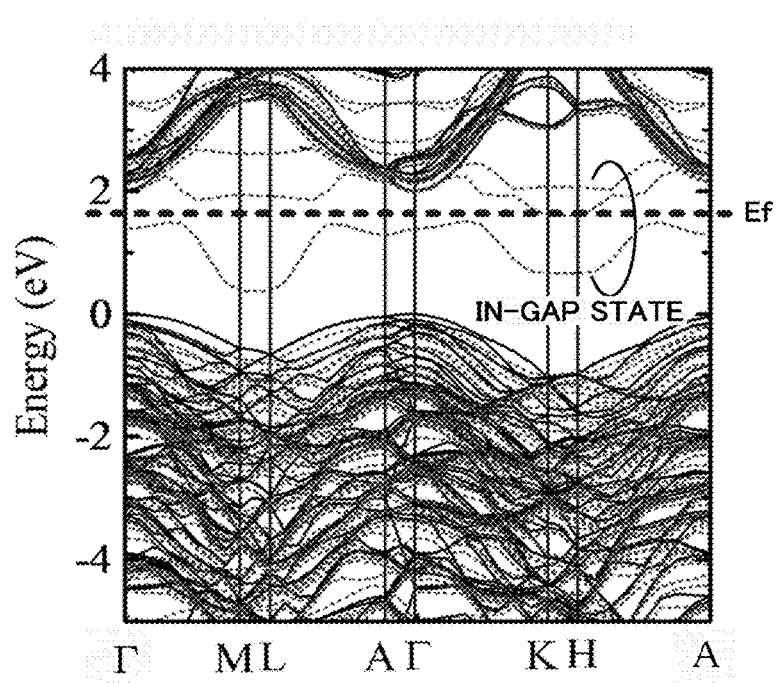
Figure 8B:
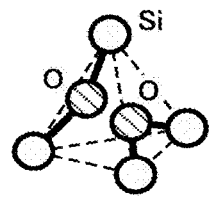
Figure 8B:
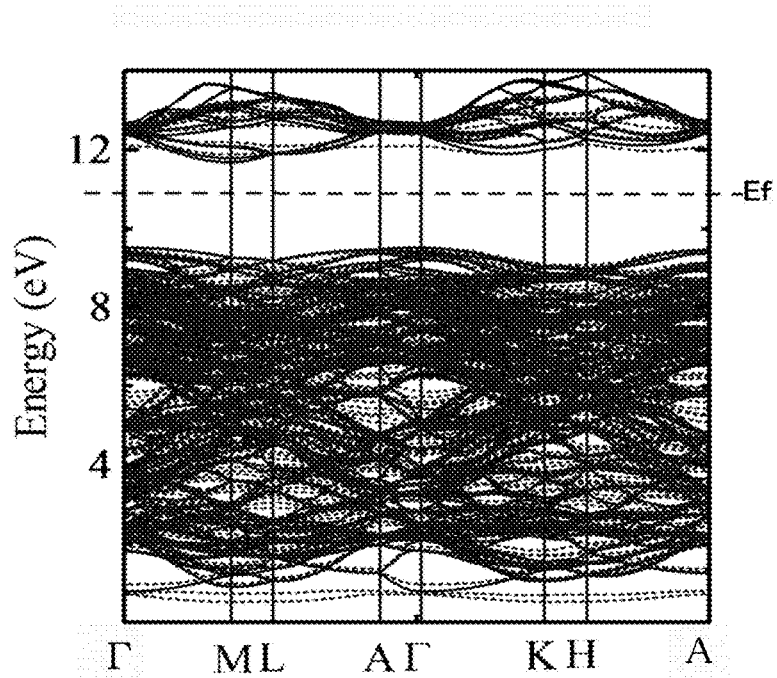

FIGS. 8A and 8B are diagrams illustrating the function of the semiconductor device and the semiconductor device manufacturing method according to this embodiment. FIG. 8A is a band diagram illustrating a case in which there is a carbon vacancy in a SiC lattice and FIG. 8B is a band diagram illustrating a case in which a carbon atom in SiC lattice is substituted with two oxygen atoms.

As shown in FIG. 8A, when a carbon vacancy is present, an in-gap state is formed in a bandgap. A localized state is formed at the lower end of the conduction band of the bandgap by the interaction of the in-gap state. In addition, a localized state is formed at the upper end of a valence band.

As shown in FIG. 8B, when a carbon atom in the SiC lattice is substituted with two oxygen atoms, the in-gap state is removed. In other words, when a pair of oxygen positioned in a carbon site of SiC lattice, the in-gap state is removed. Therefore, the localized state of an electron or a hole in the bandgap is not formed.

When carbon vacancies are present in the vicinity of the interface between the n-type SiC region and the electrode including metal, electrons or holes are trapped in the localized state in the bandgap. Local Fermi level pinning occurs in the region in which electrons or holes are trapped. Therefore, a portion in which the Schottky barrier is low is locally generated between the n-type SiC region and the electrode.

When the portion in which the Schottky barrier is low is locally generated, there is a concern that the portion will cause, for example, a variation in the on-voltage ($V_F$) of the SBD. In addition, when the portion in which the Schottky barrier is low is locally generated, for example, an excessive amount of forward current (on-current) flows to the portion in which the Schottky barrier is low and the SBD 100 is likely to be broken.

As described above, it has been found that the carbon vacancies that are present in the vicinity of the interface between the n-type SiC region and the electrode cause a variation in the on-voltage (Vs) of the SBD or the breakdown of the SBD.

The carbon vacancies in the vicinity of the interface between the SiC region and the electrode in the SBD are formed by, for example, the epitaxial growth of SiC or the oxidation of SiC.

In the SBD 100 according to this embodiment, the oxygen region 14 is provided in a portion of the drift region 12 which is disposed immediately below the anode electrode 16. In other words, the oxygen region 14 is provided in the vicinity of the interface between the drift region 12 and the anode electrode 16 so as to be close to the drift region 12.

In the oxygen region 14, the carbon vacancy is substituted with two oxygen atoms to reduce the density of the carbon vacancies. Therefore, Fermi level pinning is prevented and the SBD 100 in which a variation in the on-voltage ($V_F$) is reduced is achieved. In addition, the SBD 100 with high breakdown tolerance is achieved.

It is preferable that the oxygen region 14 be provided at a position close to the interface between the drift region 12 and the anode electrode 16 in order to prevent Fermi level pinning. From this point of view, the distance between the anode electrode 16 and the vertex of the peak of the oxygen concentration of the oxygen region 14 is preferably equal to or less than 10 nm, more preferably equal to or less than 5 nm, and most preferably equal to or less than 3 nm.

For example, when the distance is equal to or less than 10 nm, equal to or less than 5 nm, and equal to or less than 3 nm, the full width at half maximum of the peak of the oxygen concentration of the oxygen region 14 is equal to or less than 10 nm, equal to or less than 5 nm, and equal to or less than 3 nm, respectively.

The distance between the electrode and the vertex of the peak of the oxygen concentration can be measured by, for example, secondary ion mass spectrometry (SIMS). For example, since metal included in the electrode is within the detection limit of SIMS, the distance to the vertex of the peak of the oxygen concentration is used as the distance between the electrode and the vertex of the peak of the oxygen concentration. The full width at half maximum of the peak of the oxygen concentration of the oxygen region 14 can be measured by, for example, SIMS.

It is preferable that the oxygen concentration of the oxygen region 14 be equal to or greater than $1\times10^{16}$ $cm^{-3}$ and equal to or less than $1\times10^{21}$ $cm^{-3}$. When the oxygen concentration is less than the above-mentioned range, there is a concern that it may be difficult to prevent Fermi level pinning. When the oxygen concentration is greater than the above-mentioned range, the oxygen region 14 functions as an insulating layer and there is a concern that an on-current will be reduced.

The oxygen concentration of the oxygen region 14 is more preferably equal to or greater than $1\times10^{17}$ $cm^{-3}$ and equal to or less than $1\times10^{20}$ $cm^{-3}$. A manufacturing process can be optimized to adjust the concentration of the generated carbon vacancies to a value that is equal to or greater than $1\times10^{17}$ $cm^{-3}$ and equal to or less than $5\times10^{20}$ $cm^{-3}$. Concentration when two oxygen atoms are introduced into each of the generated carbon vacancies is optimum concentration. The oxygen concentration of the oxygen region 14 can be measured by, for example, SIMS.

It is preferable that there is a Si—O—Si bond in the oxygen region 14. Whether a Si—O—Si bond is present can be determined by measurement using X-ray photoelectron spectroscopy (XPS) or a Fourier transform infrared spectrometer (FT-IR device).

It is preferable that oxygen in the oxygen region 14 substitute carbon in the SiC lattice. Whether oxygen in the oxygen region 14 has substituted carbon in the SiC lattice can be determined by measurement using XPS or FT-IR device.

The carbon vacancies are randomly distributed in the drift region 12. Therefore, the distribution of oxygen in the oxygen region 14 formed by introducing oxygen atoms into the carbon vacancies is also random. The distribution of oxygen in the oxygen region 14 can be analyzed by, for example, a three-dimensional atom probe.

In the method for manufacturing the SBD 100 according to this embodiment, the oxygen region 14 is formed in an atmosphere including oxygen under the condition that SiC is not substantially oxidized. That is, a heat treatment is performed under the condition that the amount of oxidation of SiC is less than 1 nm. For example, the heat treatment is performed at a low temperature that is equal to or more than 300° C. and equal to or less than 900° C.

When a heat treatment is performed in an atmosphere including oxygen under the condition that SiC is not substantially oxidized, the excessive supply of oxygen to SiC is prevented. Therefore, the formation of carbon vacancies by the first and second carbon vacancy formation modes is prevented. Therefore, since oxygen is moderately supplied, a carbon vacancy in SiC is substituted with two oxygen atoms and the number of carbon vacancies in the SiC is reduced.

When the anode electrode 16 is formed on the carbon face which is oxidized at a higher speed than the silicon face, a heat treatment for forming the oxygen region 14 is preferably performed at a temperature that is, for example, equal to or more than 300° C. and equal to or less than 800° C. The oxidation speed of the a-face or the m-face is an intermediate value between the oxidation speed of the silicon face and the oxidation speed of the carbon face. Therefore, when the anode electrode 16 is formed on the a-face or the m-face, the heat treatment is preferably performed at a temperature that is, for example, equal to or more than 300° C. and equal to or less than 850° C.

The preferred temperature of the heat treatment depends on a plane direction. Preferably, the heat treatment is performed at a temperature that is equal to or more than 300° C. and equal to or less than 800° C. in the carbon face, is performed at a temperature that is equal to or more than 300° C. and equal to or less than 850° C. in the a-face or the m-face, and is performed at a temperature that is equal to or more than 300° C. and equal to or less than 900° C. in the silicon face.

When the temperature of the heat treatment is not more than the above-mentioned range, the amount of oxidation of SiC is not equal to or greater than 1 nm even in, for example, atmosphere pressure oxidation for 6 hours or more. When the temperature of the heat treatment is less than the above-mentioned range, the diffusion of oxygen to the drift region 12 is insufficient and there is a concern that the oxygen region 14 will not be formed.

It is preferable that the thermally oxidized film 19 be formed by thermal oxidation before the oxygen region 14 is formed. When the thermally oxidized film 19 is formed, interstitial carbon is diffused into the drift region 12 and enters carbon vacancies in a deep portion of the drift region 12. Therefore, the density of carbon vacancies in the deep portion of the drift region 12 is reduced. The carbon vacancy in the deep portion of the drift region 12 functions as a recombination center between an electron and a hole. When the density of the carbon vacancies in the deep portion of the drift region 12 increases, the lifetime of carriers is reduced.

For example, thermal oxidation is performed in an oxidizing atmosphere at a temperature that is equal to or more than 1200° C. and equal to or less than 1500° C. When the temperature is less than the above-mentioned range, interstitial carbon is not sufficiently diffused and there is a concern that the density of the carbon vacancies in the deep portion of the drift region 12 will increase. When the temperature is more than the above-mentioned range, there is a concern that the density of the carbon vacancies in the front surface of the drift region 12 will be too large. The temperature of the thermal oxidation is preferably equal to or greater than 1300° C. and equal to or less than 1400° C. and is, for example, 1350° C.

As described above, according to this embodiment, a variation in the height of the Schottky barrier between the anode electrode 16 and the drift region 12 is prevented. Therefore, the SBD 100 in which a variation in the on-voltage ($V_F$) is reduced is achieved. In addition, the SBD 100 with high breakdown tolerance is achieved.

Second Embodiment

A semiconductor device according to this embodiment is the same as the semiconductor device according to the first embodiment except that it further includes a plurality of p-type second SiC regions which come into contact with a first electrode (electrode) and are provided between the first electrode and the first SiC region. Therefore, the description of the same content as that in the first embodiment will not be repeated. The semiconductor device according to this embodiment is a junction barrier Schottky (JBS) diode.

Figure 9:
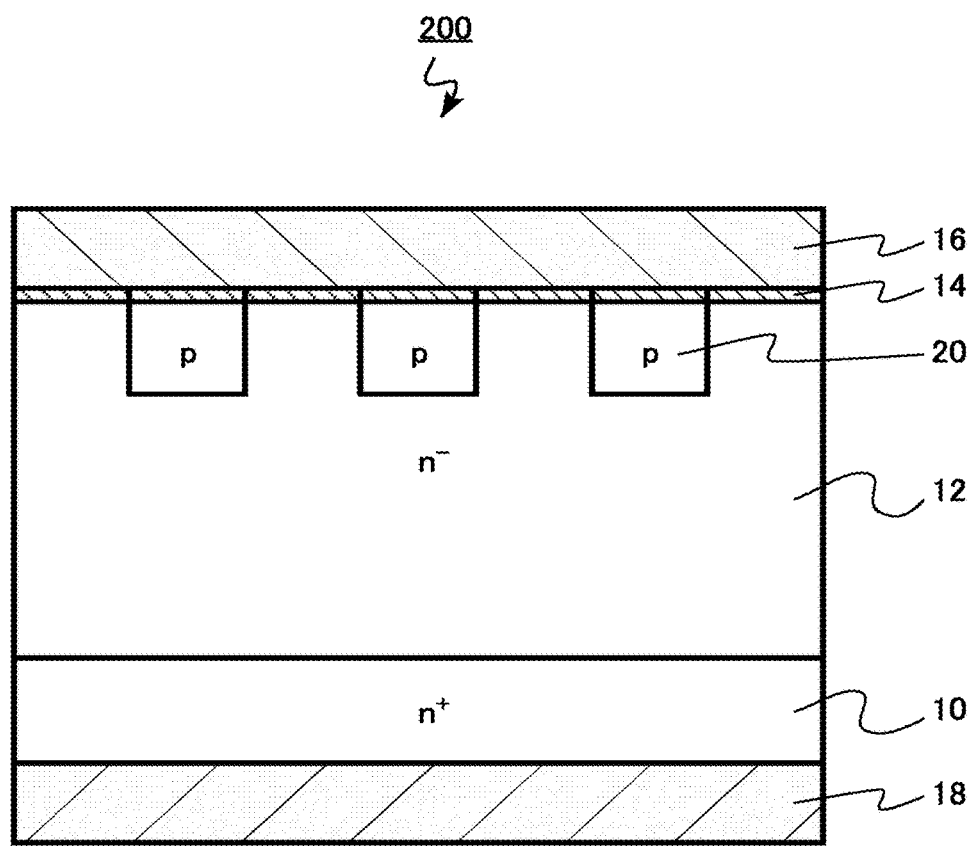
FIG. 9 is a cross-sectional view schematically illustrating a semiconductor device according to a second embodiment.

FIG. 9 is a cross-sectional view schematically illustrating the structure of a JBS diode 200 which is the semiconductor device according to this embodiment.

The JBS diode 200 includes an n$^+$ SiC substrate 10, an n$^-$ drift region (first SiC region) 12, a p-type second SiC region 20, an oxygen region (region) 14, an anode electrode (first electrode) 16, and a cathode electrode (second electrode) 18.

The p-type second SiC region 20 comes into contact with the anode electrode 16. The second SiC region 20 is provided between the drift region 12 and the anode electrode 16. A plurality of second SiC regions 20 are selectively provided in a surface of the drift region 12. The second SiC region 20 includes p-type impurities. The concentration of the p-type impurities is, for example, equal to or greater than $1 \times 10^{18}$ cm$^{-3}$ and equal to or less than $1 \times 10^{21}$ cm$^{-3}$.

The oxygen region (region) 14 is also provided in the p-type second SiC region 20 so as to be close to the anode electrode 16.

In the JBS diode 200, when a reverse bias is applied, a depletion layer is formed between the second SiC regions 20 in the drift region 12. Therefore, when a reverse bias is applied, the generation of a leakage current is prevented.

As described above, according to this embodiment, a variation in the height of the Schottky barrier between the anode electrode 16 and the drift region 12 is prevented by the same function as that in the first embodiment. Therefore, the JBS diode 200 in which a variation in an on-voltage ($V_F$) is reduced is achieved. In addition, the JBS diode 200 with high breakdown tolerance is achieved. The JBS diode 200 in which the generation of a leakage current is prevented when a reverse bias is applied is achieved.

Third Embodiment

A semiconductor device according to this embodiment is the same as the semiconductor device according to the second embodiment except that it further includes a p-type third SiC region which comes into contact with the first electrode, is provided between the p-type second SiC region and the first electrode, and has a higher p-type impurity concentration than the p-type second SiC region. Therefore, the description of the same content as that in the second embodiment will not be repeated. The semiconductor device according to this embodiment is a merged PiN/Schottky (MPS) diode.

Figure 10:
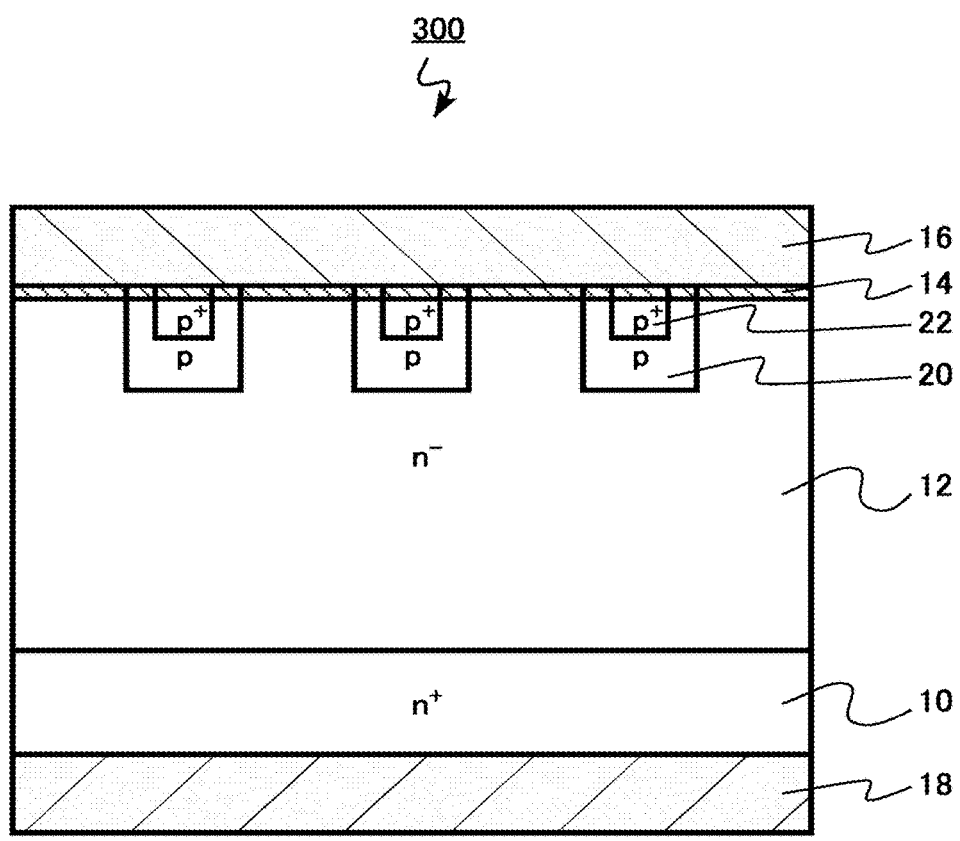
FIG. 10 is a cross-sectional view schematically illustrating a semiconductor device according to a third embodiment.

FIG. 10 is a cross-sectional view schematically illustrating the structure of an MPS diode 300 which is the semiconductor device according to this embodiment.

The MPS diode 300 includes an n$^+$ SiC substrate 10, an n$^-$ drift region (first SiC region) 12, a p-type second SiC region 20, a p$^+$ third SiC region 22, an oxygen region (region) 14, an anode electrode (first electrode) 16, and a cathode electrode (second electrode) 18.

The p-type second SiC region 20 is provided between the drift region 12 and the anode electrode 16. A plurality of second SiC regions 20 are selectively provided in a surface of the drift region 12. The second SiC region 20 includes p-type impurities. The concentration of the p-type impurities is, for example, equal to or greater than $1 \times 10^{18}$ cm$^{-3}$ and equal to or less than $1 \times 10^{21}$ cm$^{-3}$.

The p$^+$ third SiC region 22 is provided so as to come into contact with the anode electrode 16. The third SiC region 22 is provided between the second SiC region 20 and the anode electrode 16. The third SiC region 22 includes p-type impurities. The p-type impurity concentration of the third SiC region 22 is higher than that of the second SiC region 20. The p-type impurity concentration of the third SiC region 22 is, for example, equal to or greater than $5 \times 10^{19}$ cm$^{-3}$ and equal to or less than $1 \times 10^{22}$ cm$^{-3}$.

The oxygen region (region) 14 is also provided in the third SiC region 22 so as to be close to the anode electrode 16.

In the MPS diode 300, when a reverse bias is applied, a depletion layer is formed between the p-type second SiC regions 20 in the drift region 12. Therefore, when a reverse bias is applied, the generation of a leakage current is prevented.

In the MPS diode 300, since the p$^+$ third SiC regions 22 are provided, the contact resistance between the third SiC region 22 and the anode electrode 16 is reduced. Therefore, when a forward bias is applied, the injection of holes from the anode electrode 16 to the drift region 12 is accelerated. As a result, conductivity modulation occurs and the amount of on-current (forward current) in the MPS diode 300 increases.

As described above, according to this embodiment, a variation in the height of the Schottky barrier between the anode electrode 16 and the drift region 12 is prevented by the same function as that in the second embodiment. Therefore, the MPS diode 300 in which a variation in an on-voltage ($V_F$) is reduced is achieved. In addition, the MPS diode 300 with high breakdown tolerance is achieved. The MPS diode 300 in which the generation of a leakage current is prevented when a reverse bias is applied is achieved. The MPS diode 300 in which the amount of on current increases is achieved.

A silicide region may be provided in a region of the anode electrode 16 which comes into contact with the third SiC region 22 in order to further reduce the contact resistance between the p$^+$ third SiC region 22 and the anode electrode 16. The silicide region is, for example, nickel silicide or titanium silicide.

Fourth Embodiment

A semiconductor device according to this embodiment is the same as the semiconductor device according to the first embodiment except that it further includes a third electrode which is provided between the n-type first SiC region (SiC region) and the first electrode (electrode), is electrically connected to the first electrode, and has a greater work function than the first electrode. The semiconductor device according to this embodiment is an SBD including an electrode that has a low barrier to the drift region and an electrode that has a high barrier to the drift region.

Figure 11:
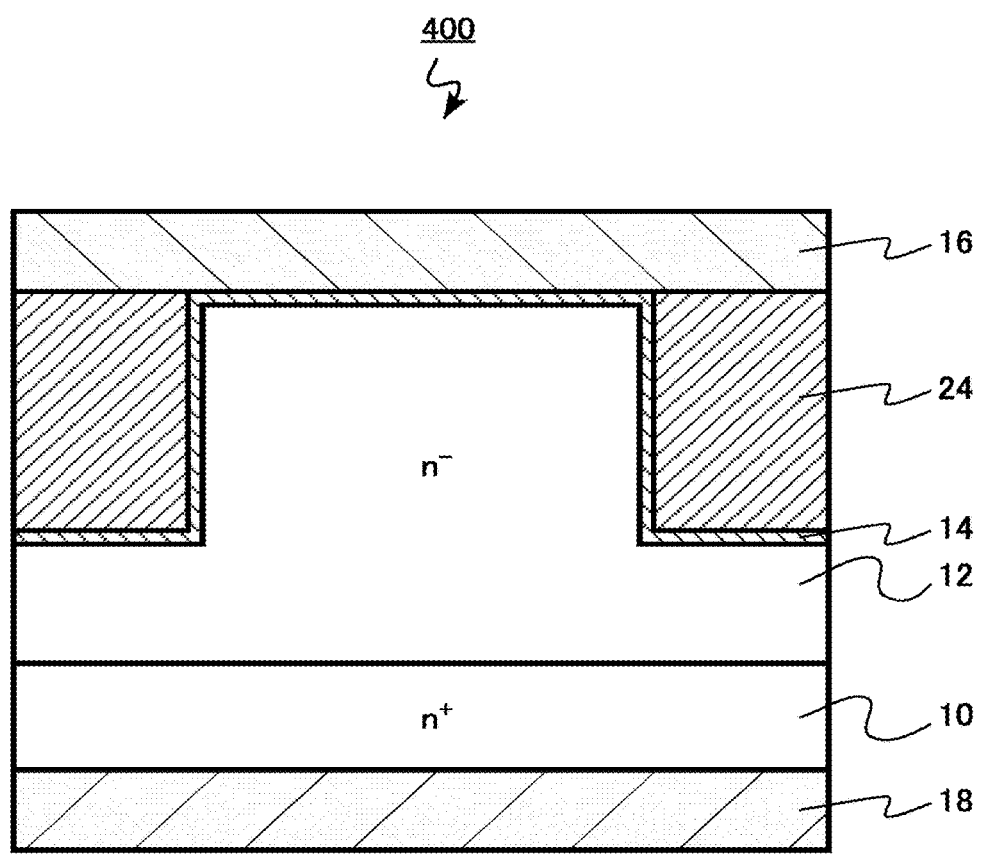
FIG. 11 is a cross-sectional view schematically illustrating a semiconductor device according to a fourth embodiment.

FIG. 11 is a cross-sectional view schematically illustrating the structure of an SBD 400 which is the semiconductor device according to this embodiment.

The SBD 400 includes an n$^+$ SiC substrate 10, an n$^-$ drift region (first SiC region) 12, an oxygen region (region) 14, an anode electrode (an electrode or a first electrode) 16, a high-barrier electrode (third electrode) 24, and a cathode electrode (second electrode) 18.

The high-barrier electrode 24 is provided between the drift region 12 and the anode electrode 16. A plurality of high-barrier electrodes 24 are provided in the drift region 12.

The high-barrier electrode 24 has a greater work function than the anode electrode 16. The high-barrier electrode 24 includes metal. For example, the metal included in the high-barrier electrode 24 has a greater work function than metal included in the anode electrode 16. The high-barrier electrode 24 is provided in a trench that is formed in the drift region 12.

The anode electrode 16 is made of metal, such as nickel (Ni), titanium (Ti), or molybdenum (Mo). The high-barrier electrode 24 is made of metal, such as gold (Au) or platinum (Pt). The high-barrier electrode 24 is made of polycrystalline 3C—SiC including conductive impurities such as aluminum (Al). In addition, the high-barrier electrode 24 is made of conductive oxide such as ruthenium oxide.

The metal included in the anode electrode is, for example, nickel (Ni), titanium (Ti), or molybdenum (Mo). The metal included in the high-barrier electrode 24 is, for example, gold (Au) or platinum (Pt).

The oxygen region (region) 14 is also provided in the drift region 12 so as to be close to the high-barrier electrode 24.

The SBD 400 has an electrode structure having two types of Schottky barrier heights, that is, a low Schottky barrier between the anode electrode 16 and the drift region 12 and a high Schottky barrier between the high-barrier electrode 24 and the drift region 12. The SBD 400 is a so-called double Schottky diode.

In the SBD 400, when a reverse bias is applied, a depletion layer is formed between the high-barrier electrodes 24 in the drift region 12. Therefore, when a reverse bias is applied, the generation of a leakage current is prevented.

Since the oxygen region 14 is provided, the height of the Schottky barrier between the high-barrier electrode 24 and the drift region 12 is stabilized. Therefore, when a reverse bias is applied, a depletion layer is stably formed and the effect of preventing the generation of a leakage current is stabilized. In addition, when a reverse bias is applied, the amount of leakage current between the high-barrier electrode 24 and the drift region 12 can be reduced.

As described above, according to this embodiment, a variation in the height of the Schottky barrier between the anode electrode 16 and the drift region 12 is prevented by the same function as that in the first embodiment. Therefore, the SBD 400 in which a variation in an on-voltage ($V_F$) is reduced is achieved. In addition, the SBD 400 with high breakdown tolerance is achieved. The SBD 400 in which the generation of a leakage current is prevented when a reverse bias is applied is achieved.

Fifth Embodiment

A semiconductor device according to this embodiment is a metal oxide semiconductor field effect transistor (MOSFET).

Figure 12:
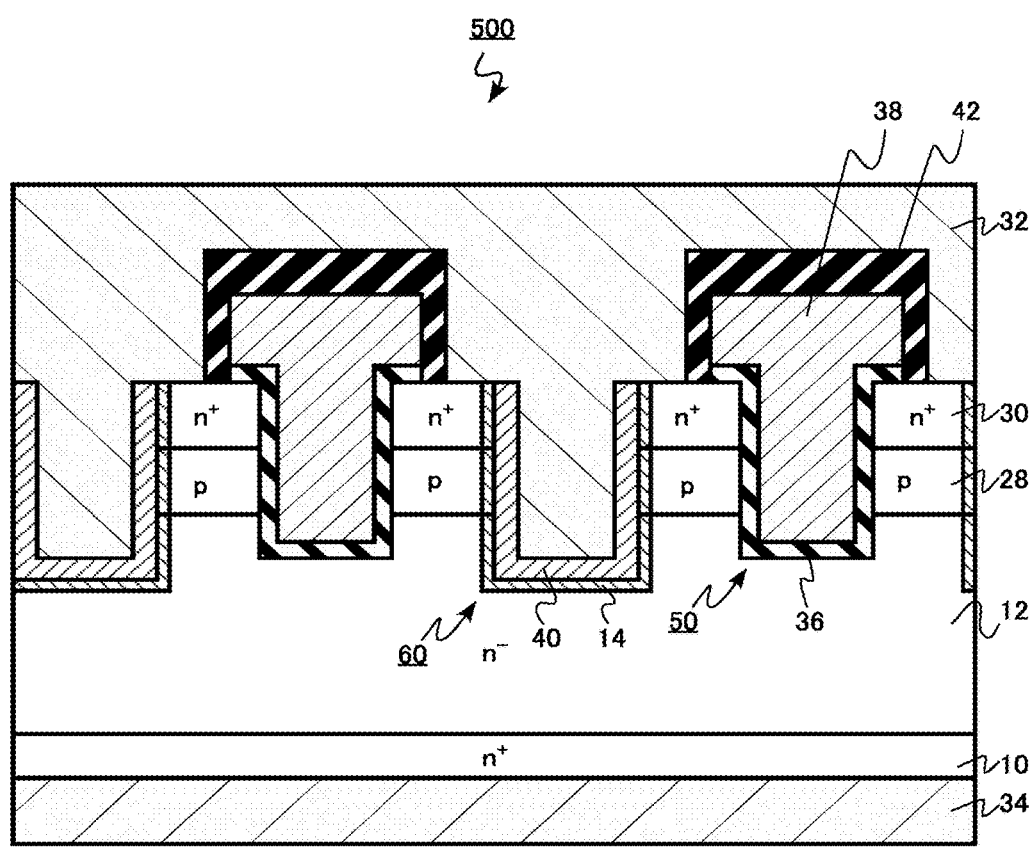
FIG. 12 is a cross-sectional view schematically illustrating a semiconductor device according to a fifth embodiment.

FIG. 12 is a cross-sectional view schematically illustrating the structure of a MOSFET 500 which is the semiconductor device according to this embodiment. The MOSFET 500 is, for example, a double implantation MOSFET (DI-MOSFET) in which a well region and a source region are formed by ion implantation. The MOSFET 500 is an n-type MOSFET having electrons as carriers. In addition, the MOSFET 500 is a MOSFET having a double trench gate structure in which a gate electrode is provided in a trench.

In this structure, a dopant is formed by ion implantation and activation annealing is performed at a high temperature of about 1700° C. to 1900° C. After the activation annealing is performed at a high temperature, the trench is formed. Therefore, after the trench is formed, high-temperature annealing is not required.

The MOSFET 500 includes an n$^+$ SiC substrate 10, an n$^-$ drift region (a SiC region or a first SiC region) 12, an oxygen region (region) 14, a p-type well region 28, an n$^+$ source region 30, a source electrode 32, a drain electrode (second electrode) 34, a gate insulating layer 36, a gate electrode 38, a metal layer (an electrode or a first electrode) 40, and an interlayer insulating layer 42. A first trench 50 and a second trench 60 are provided in the drift region 12.

The n$^+$ SiC substrate 10 includes, for example nitrogen (N) as n-type impurities of which the concentration is, for example, equal to or greater than $1\times10^{18}$ cm$^{-3}$ and equal to or less than $1\times10^{21}$ cm$^{-3}$. The n$^+$ SiC substrate 10 is, for example, a 4H—SiC substrate.

Next, an example in which an upper surface of the SiC substrate 10 is inclined at an angle that is equal to or greater than 0 degrees and equal to or less than 8 degrees with respect to a silicon face and a lower surface thereof is inclined at an angle that is equal to or greater than 0 degrees and equal to or less than 8 degrees with respect to a carbon face will be described. The surface which is inclined at an angle that is equal to or greater than 0 degrees and equal to or less than 8 degrees with respect to the silicon face and the surface which is inclined at an angle that is equal to or greater than 0 degrees and equal to or less than 8 degrees with respect to the carbon face can be regarded to be substantially the same as the silicon face and the carbon face in terms of characteristics.

The n$^-$ drift region 12 is, for example, a SiC epitaxial growth layer that is formed on the SiC substrate 10 by epitaxial growth. The n-type impurity concentration of the drift region 12 is, for example, equal to or greater than $5\times10^{15}$ cm$^{-3}$ and equal to or less than $5\times10^{16}$ cm$^{-3}$.

A surface of the drift region 12 is inclined at an angle that is equal to or greater than 0 degrees and equal to or less than 8 degrees with respect to the silicon face. The thickness of the drift region 12 is, for example, equal to or greater than 5 μm and equal to or less than 150 μm.

The well region 28 is provided on the drift region 12. The well region 28 is a p-type SiC region. The well region 28 is provided between the source region 30 and the drift region 12. The well region 28 functions as a channel region of the MOSFET 500.

The well region 28 includes, for example, aluminum (Al) as p-type impurities. The p-type impurity concentration of the well region 28 is, for example, equal to or greater than $5\times10^{15}$ cm$^{-3}$ and equal to or less than $1\times10^{18}$ cm$^{-3}$. The depth of the well region 28 is, for example, equal to or greater than 0.4 μm and equal to or less than 0.8 μm.

A plurality of source regions 30 are provided between the source electrode 32 and the well region 28. The source region 30 is provided on the well region 28. The source region 30 is an n$^+$ SiC region. The source region 30 includes, for example, phosphorus (P) as n-type impurities. The n-type impurity concentration of the source region 30 is, for example, equal to or greater than $1\times10^{18}$ cm$^{-3}$ and equal to or less than $1\times10^{21}$ cm$^{-3}$.

The concentration of the n-type impurities in the surface of the source region 30 is preferably equal to or greater than $1\times10^{19}$ cm$^{-3}$ and more preferably equal to or greater than $1\times10^{20}$ cm$^{-3}$, in order to reduce the contact resistance between the source electrode 32 and the source region 30.

The depth of the source region 30 is less than the depth of the well region 28 and is, for example, equal to or greater than 0.2 μm and equal to or less than 0.4 μm.

The gate insulating layer 36 is provided in the first trench 50 formed in the drift region 12. The gate insulating layer 36 is provided between the gate electrode 38 and the drift region 12 and between the gate electrode 38 and the well region 28. The gate insulating layer 36 comes into contact with the drift region 12, the well region 28, and the source region 30.

For example, silicon oxide or a high-k material can be applied to the gate insulating layer 36. The high-k material is, for example, hafnium oxide or zirconium oxide.

The gate electrode 38 is provided in the first trench 50. The gate electrode 38 comes into contact with the gate insulating layer 36. The gate electrode 38 is provided between two well regions 28 among a plurality of well regions 28.

The gate electrode 38 is made of, for example, polycrystalline silicon including n-type impurities. The n-type impurity is, for example, phosphorus (P) or arsenic (As).

The interlayer insulating layer 42 is provided on the gate electrode 38. The interlayer insulating layer 42 is, for example, a silicon oxide film.

The metal layer 40 is provided in the second trench 60 formed in the drift region 12. The metal layer 40 is provided between the gate insulating layers 36, with the drift region 12 interposed therebetween. The depth of the second trench 60 is greater than, for example, the depth of the first trench 50.

The metal layer 40 comes into contact with the drift region 12, the well region 28, and the source region 30. The junction between the metal layer 40 and the drift region 12 is a Schottky junction. The work function of the metal layer 40 is greater than the work function of the source electrode 32. Whether the junction between the metal layer 40 and the drift region 12 is the Schottky junction can be determined by measuring voltage-current characteristics between the source electrode 32 and the drain electrode 34 when the MOSFET 500 is in an off state.

It is preferable that the junction between the metal layer 40 and the well region 28 be an ohmic junction.

The metal layer 40 is made of metal such as gold (Au) or platinum (Pt). The metal layer 40 is, for example, a polycrystalline 3C—SiC layer including conductive impurity such as aluminum (Al). The metal layer 40 is made of a conductive oxide such as ruthenium oxide.

The oxygen region (region) 14 including oxygen is provided in the drift region 12 so as to be close to the metal layer 40. The oxygen concentration of the oxygen region 14 is, for example, equal to or greater than $1\times10^{16}$ cm$^{-3}$ and equal to or less than $1\times10^{21}$ cm$^{-3}$. In addition, the oxygen concentration of the oxygen region 14 is, for example, equal to or greater than $1\times10^{17}$ cm$^{-3}$ and equal to or less than $1\times10^{20}$ cm$^{-3}$.

The oxygen region 14 is a SiC region including oxygen. The oxygen region 14 has a structure in which two oxygen atoms substitute one carbon atom in a SiC lattice. In the oxygen region 14, the carbon vacancy density of the SiC region is reduced by this structure. This structure causes a Si—O—Si bond to be present in the oxygen region 14.

The source electrode 32 is provided on the surface of the source region 30. The source electrode 32 is electrically connected to the source region 30 and the metal layer 40. The source electrode 32 comes into contact with the source region 30 and the metal layer 40. The source electrode 32 also has a function of applying potential to the well region 28.

The source electrode 32 includes metal. The metal included in the source electrode 32 is, for example, nickel (Ni), titanium (Ti), or molybdenum (Mo). The source electrode 32 may be a stacked structure of a plurality of metal films. In addition, the source electrode 32 may be made of an alloy of a plurality of metal materials. The source electrode 32 may include a metal semiconductor compound such as metal silicide or metal carbide.

The drain electrode 34 is provided on the rear surface of the SiC substrate 10. The drain electrode 34 is electrically connected to the drift region 12. The drain electrode 34 comes into contact with the SiC substrate 10.

The drain electrode 34 includes metal. The metal included in the drain electrode 34 is, for example, nickel (Ni), titanium (Ti), or molybdenum (Mo). The drain electrode 34 may be a stacked structure of a plurality of metal films. In addition, the drain electrode 34 may be made of an alloy of a plurality of metal materials. The drain electrode 34 may include a metal semiconductor compound such as metal silicide or metal carbide. The drain electrode 34 is made of, for example, nickel silicide (NiSi).

Next, the function and effect of the semiconductor device according to this embodiment will be described.

As in the MOSFET 500 according to this embodiment, when the trench gate structure is used, it is possible to reduce the area of a unit cell of a vertical MOSFET. Therefore, the amount of current per unit area increases and the on-resistance of the MOSFET is reduced. However, when the MOSFET 500 is in an off state, the electric field is concentrated on the corners of the bottom of the first trench 50 and there is a concern that the gate insulating layer 36 will be broken.

In this embodiment, the metal layer 40 which has a greater work function than the source electrode 32 is provided in the second trench 60. The junction between the metal layer 40 and the n$^-$ drift region 12 is the Schottky junction.

When the MOSFET 500 is in an off state, a depletion layer extends from the metal layer 40 to the first trench 50 in the drift region 12. Therefore, the electric field at the corner of the bottom of the first trench 50 is reduced. As a result, the breakdown of the gate insulating layer 36 is prevented.

For example, a structure is considered in which, instead of the metal layer 40, a p-type SiC region is provided around the second trench 60 such that a depletion layer extends in the drift region 12. However, in this structure, tilted ion implantation is required to form the p-type SiC region, which makes it difficult to reduce the area of the unit cell. In this embodiment, since the metal layer 40 is provided in the second trench 60, it is possible to reduce the area of the unit cell.

It is preferable that the depth of the second trench 60 be greater than the depth of the first trench 50. When the depth of the second trench 60 is greater than the depth of the first trench 50, it is possible to improve the effect of reducing the electric field at the corner of the bottom of the first trench 50.

Since the oxygen region 14 is provided, the height of the Schottky barrier between the metal layer 40 and the drift region 12 is stabilized. Therefore, when a reverse bias is applied, a depletion layer is stably formed and the effect of preventing the breakdown of the gate insulating layer 36 is stabilized. As a result, the reliability of the MOSFET 500 is improved.

As described above, according to this embodiment, the MOSFET 500 having low on-resistance is achieved. In addition, since the height of the Schottky barrier between the metal layer 40 and the drift region 12 is stabilized, the MOSFET 500 with high reliability is achieved.

First Modification Example of Fifth Embodiment

A semiconductor device according to this modification example is the same as the semiconductor device according to the fifth embodiment except that it further includes a p-type well contact region. Therefore, the description of the same content as that in the fifth embodiment will not be repeated.

Figure 13:
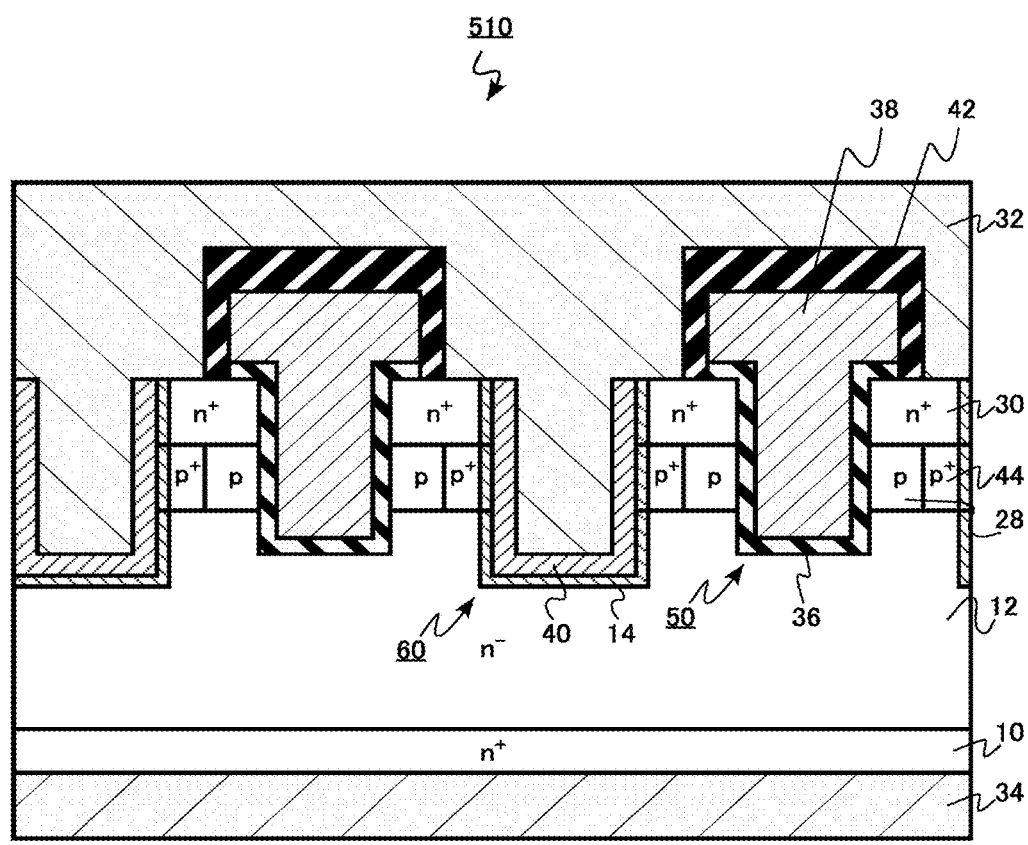
FIG. 13 is a cross-sectional view schematically illustrating a semiconductor device according to a first modification example of the fifth embodiment.

FIG. 13 is a cross-sectional view schematically illustrating the structure of a MOSFET 510 which is the semiconductor device according to this modification example. The MOSFET 510 includes an n⁺ SiC substrate 10, an n⁻ drift region (a SiC region or a first SiC region) 12, an oxygen region (region) 14, a p-type well region 28, a p⁺ well contact region 44, an n⁺ source region 30, a source electrode 32, a drain electrode (second electrode) 34, a gate insulating layer 36, a gate electrode 38, a metal layer (an electrode or a first electrode) 40, and an interlayer insulating layer 42. A first trench 50 and a second trench 60 are provided in the drift region 12.

The p⁺ well contact region 44 is provided between the metal layer 40 and the well region 28. The well contact region 44 is a p⁺ SiC region. The well contact region 44 includes, for example, Al as p-type impurities.

The p-type impurity concentration of the well contact region 44 is higher than the p-type impurity concentration of the well region 28. The p-type impurity concentration of the well contact region 44 is, for example, equal to or greater than $1\times10^{18}$ cm⁻³ and equal to or less than $1\times10^{21}$ cm⁻³.

The contact resistance between the well contact region 44 and the metal layer 40 is reduced by the well contact region 44. In particular, since the oxygen region 14 is provided in the well contact region 44 so as to be close to the metal layer 40, Fermi level pinning is prevented and the contact resistance is reduced. Therefore, a stable potential is applied to the well region 28 and the operation of the MOSFET 510 is stabilized.

As described above, according to this embodiment, similarly to the fifth embodiment, the MOSFET 510 having low on-resistance is achieved. In addition, since the height of the Schottky barrier between the metal layer 40 and the drift region 12 is stabilized, the MOSFET 510 with high reliability is achieved. Since a stable potential is applied to the well region 28, the operation of the MOSFET 510 is stabilized.

Second Modification Example of Fifth Embodiment

A semiconductor device according to this modification example is the same as the semiconductor device according to the fifth embodiment except that it further includes a p-type electric field reducing region and a p-type anode region. Therefore, the description of the same content as that in the fifth embodiment will not be repeated.

Figure 14:
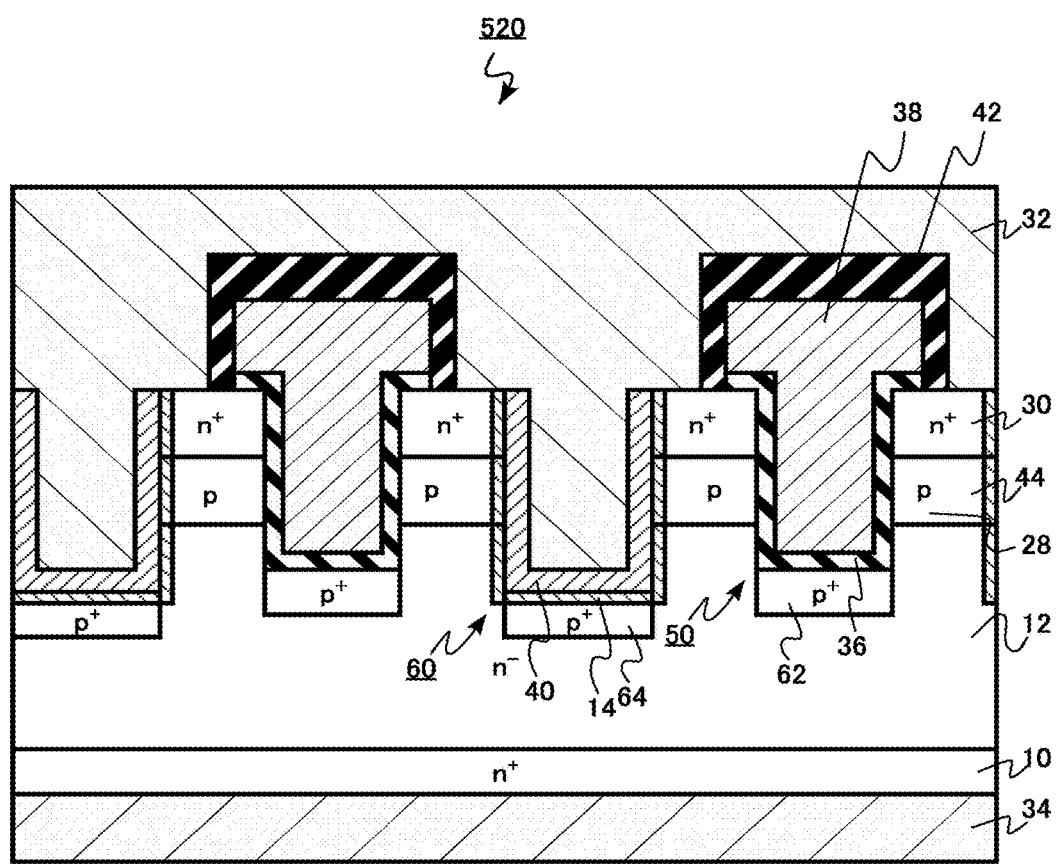
FIG. 14 is a cross-sectional view schematically illustrating a semiconductor device according to a second modification example of the fifth embodiment.

FIG. 14 is a cross-sectional view schematically illustrating the structure of a MOSFET 520 which is the semiconductor device according to this modification example. The MOSFET 520 includes an n⁺ SiC substrate 10, an n⁻ drift region (a SiC region or a first SiC region) 12, an oxygen region (region) 14, a p-type well region 28, an n⁺ source region 30, a p⁺ electric field reducing region 62, a p⁺ anode region 64, a source electrode 32, a drain electrode (second electrode) 34, a gate insulating layer 36, a gate electrode 38, a metal layer (an electrode or a first electrode) 40, and an interlayer insulating layer 42. A first trench 50 and a second trench 60 are provided in the drift region 12.

The p⁺ electric field reducing region 62 is provided between the gate insulating layer 36 at the bottom of the first trench 50 and the drift region 12. The electric field reducing region 62 is a p⁺ SiC region.

The electric field reducing region 62 includes, for example, Al as p-type impurities. The p-type impurity concentration of the electric field reducing region 62 is, for example, equal to or greater than $1\times10^{18}$ cm⁻³ and equal to or less than $1\times10^{21}$ cm⁻³.

The p⁺ anode region 64 is provided between the metal layer 40 at the bottom of the second trench 60 and the drift region 12. The anode region 64 is a p⁺ SiC region.

The anode region 64 includes, for example, Al as p-type impurities. The p-type impurity concentration of the anode region 64 is, for example, equal to or greater than $1\times10^{18}$ cm⁻³ and equal to or less than $1\times10^{21}$ cm⁻³.

The source electrode 32, the metal layer 40, the anode region 64, the drift region 12, the SiC substrate 10, and the drain electrode 34 form a PiN diode. The PiN diode functions as a so-called body diode (free wheeling diode).

When a voltage that is positive with respect to the drain electrode 34 is applied to the source electrode 32, the body diode is turned on and a current flows from the source electrode 32 to the drain electrode 34. In contrast, when the MOSFET 520 is turned on, that is, a voltage that is negative with respect to the drain electrode 34 is applied to the source electrode 32, the body diode is turned off.

For example, when the MOSFET 520 is applied as a switching device of an inverter, the PiN diode enables a large amount of return current to flow through the MOSFET 520.

In particular, since the oxygen region 14 is provided in the anode region 64 so as to be close to the metal layer 40, Fermi level pinning is prevented and contact resistance is reduced. Therefore, the amount of forward current in the PiN diode increases.

In addition, since the electric field reducing region 62 is provided at the bottom of the first trench 50, the concentration of the electric field on the corner of the bottom of the first trench 50 is further reduced. In addition, the electric field is reduced at the bottom of the first trench 50 by the extension of a depletion layer from the anode region 64. Therefore, the breakdown of the gate insulating layer 36 is further prevented.

As described above, according to this embodiment, similarly to the fifth embodiment, the MOSFET 520 having low on-resistance is achieved. In addition, since the height of the Schottky barrier between the metal layer 40 and the drift region 12 is stabilized, the MOSFET 520 with high reliability is achieved. Since the anode region 64 is provided, the MOSFET 520 in which a large amount of return current can flow is achieved. The MOSFET 520 of which the reliability is further improved is achieved.

Third Modification Example of Fifth Embodiment

A semiconductor device according to this modification example is the same as the semiconductor device according to the first modification example of the fifth embodiment except that the depth of the p-type well contact region is greater than the depth of the p-type well region. Therefore, the description of the same content as that in the first modification example of the fifth embodiment will not be repeated.

Figure 15:
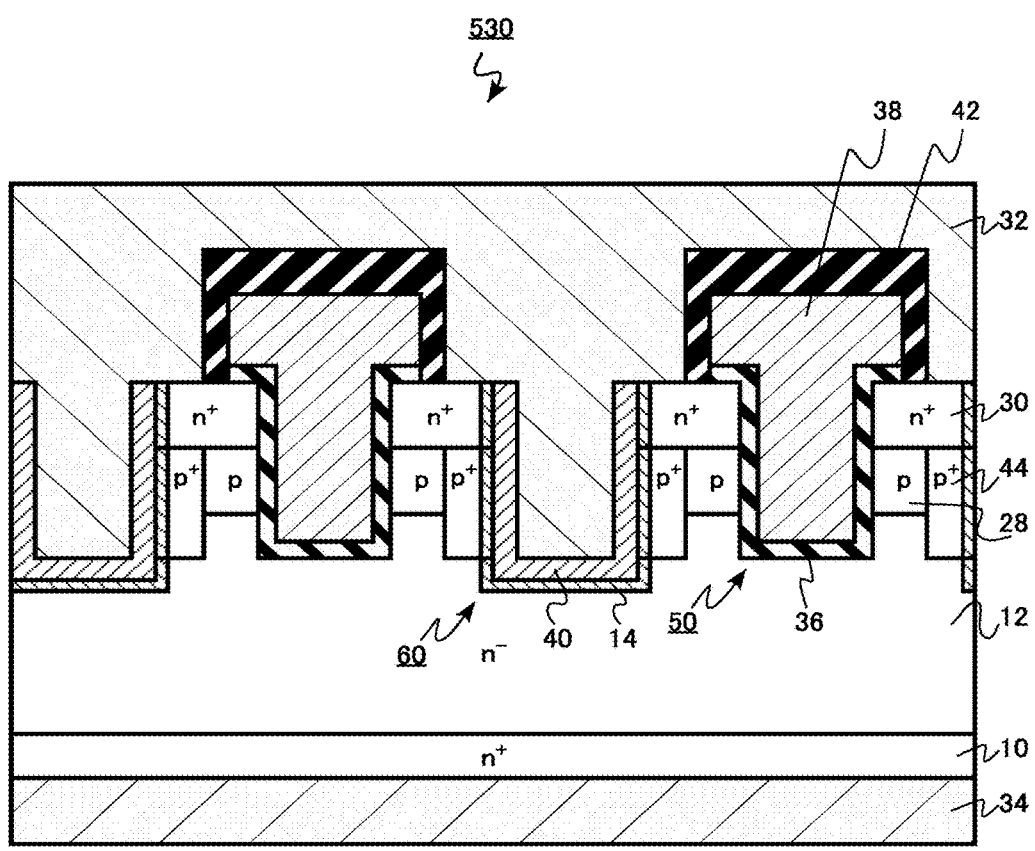
FIG. 15 is a cross-sectional view schematically illustrating a semiconductor device according to a third modification example of the fifth embodiment.

FIG. 15 is a cross-sectional view schematically illustrating the structure of a MOSFET 530 which is the semiconductor device according to this modification example. The MOSFET 530 includes an n⁺ SiC substrate 10, an n⁻ drift region (n-type SiC region) 12, an oxygen region (region) 14, a p-type well region 28, a p⁺ well contact region 44, a source region 30, a source electrode 32, a drain electrode 34, a gate insulating layer 36, a gate electrode 38, a metal layer (an electrode or a first electrode) 40, and an interlayer insulating layer 42. A first trench 50 and a second trench 60 are provided in the drift region 12.

The p+ well contact region 44 is provided between the metal layer 40 and the well region 28. The well contact region 44 is a p+ SiC region. The well contact region 44 includes, for example, Al as p-type impurities. The depth of the well contact region 44 is greater than the depth of the well region 28.

The p-type impurity concentration of the well contact region 44 is higher than the p-type impurity concentration of the well region 28. The p-type impurity concentration of the well contact region 44 is, for example, equal to or greater than $1 \times 10^{18}$ cm$^{-3}$ and equal to or less than $1 \times 10^{21}$ cm$^{-3}$.

The contact resistance between the well contact region 44 and the metal layer 40 is reduced by the well contact region 44. In particular, since the oxygen region 14 is provided in the well contact region 44 so as to be close to the metal layer 40, Fermi level pinning is prevented and the contact resistance is reduced. Therefore, a stable potential is applied to the well region 28 and the operation of the MOSFET 530 is stabilized.

The source electrode 32, the metal layer 40, the well contact region 44, the drift region 12, the SiC substrate 10, and the drain electrode 34 form a PiN diode. The PiN diode functions as a body diode.

As described above, according to this modification example, similarly to the first modification example of the fifth embodiment, the MOSFET 530 having low on-resistance is achieved. In addition, since the height of the Schottky barrier between the metal layer 40 and the drift region 12 is stabilized, the MOSFET 530 with high reliability is achieved. A stable potential is applied to the well region 28 and the operation of the MOSFET 530 is stabilized. Since the deep well contact region 44 is provided, the MOSFET 530 in which a large amount of return current can flow is achieved.

Fourth Modification Example of Fifth Embodiment

A semiconductor device according to this modification example is the same as the semiconductor device according to the third modification example of the fifth embodiment except that the second trench is filled with a metal layer. Therefore, the description of the same content as that in the third modification example of the fifth embodiment will not be repeated.

Figure 16:
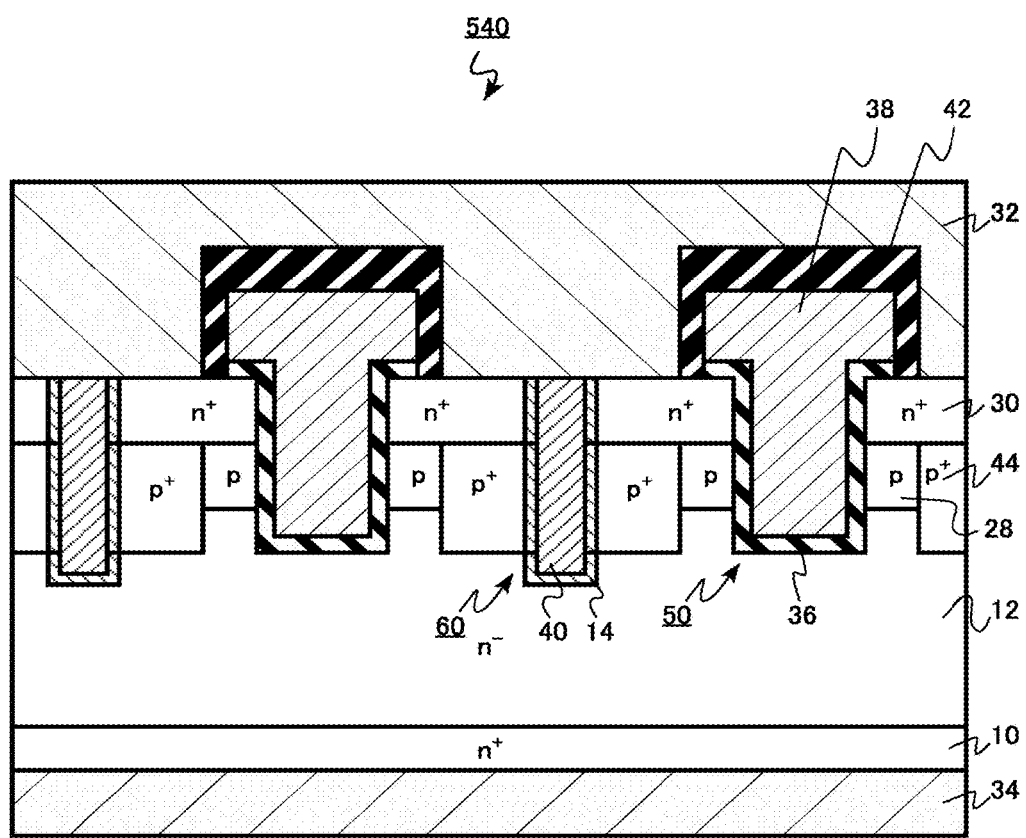
FIG. 16 is a cross-sectional view schematically illustrating a semiconductor device according to a fourth modification example of the fifth embodiment.

FIG. 16 is a cross-sectional view schematically illustrating the structure of a MOSFET 540 which is the semiconductor device according to this modification example. The MOSFET 540 includes an n+ SiC substrate 10, an n− drift region (n-type SiC region) 12, an oxygen region (region) 14, a p-type well region 28, a p+ well contact region 44, a source region 30, a source electrode 32, a drain electrode 34, a gate insulating layer 36, a gate electrode 38, a metal layer (an electrode or a first electrode) 40, and an interlayer insulating layer 42. A first trench 50 and a second trench 60 are provided in the drift region 12.

The second trench 60 is filled with the metal layer 40.

According to this modification example, similarly to the first modification example of the fifth embodiment, the MOSFET 540 having low on-resistance is achieved. In addition, since the height of the Schottky barrier between the metal layer 40 and the drift region 12 is stabilized, the MOSFET 540 with high reliability is achieved. A stable potential is applied to the well region 28 and the operation of the MOSFET 540 is stabilized. Since the deep well contact region 44 is provided, the MOSFET 540 in which a large amount of return current can flow is achieved.

Sixth Embodiment

A semiconductor device according to this embodiment is different from the semiconductor device according to the fifth embodiment in that it includes an SBD having two types of Schottky barrier heights as a free wheeling diode. Therefore, the description of the same content as that in the fifth embodiment will not be repeated.

Figure 17:
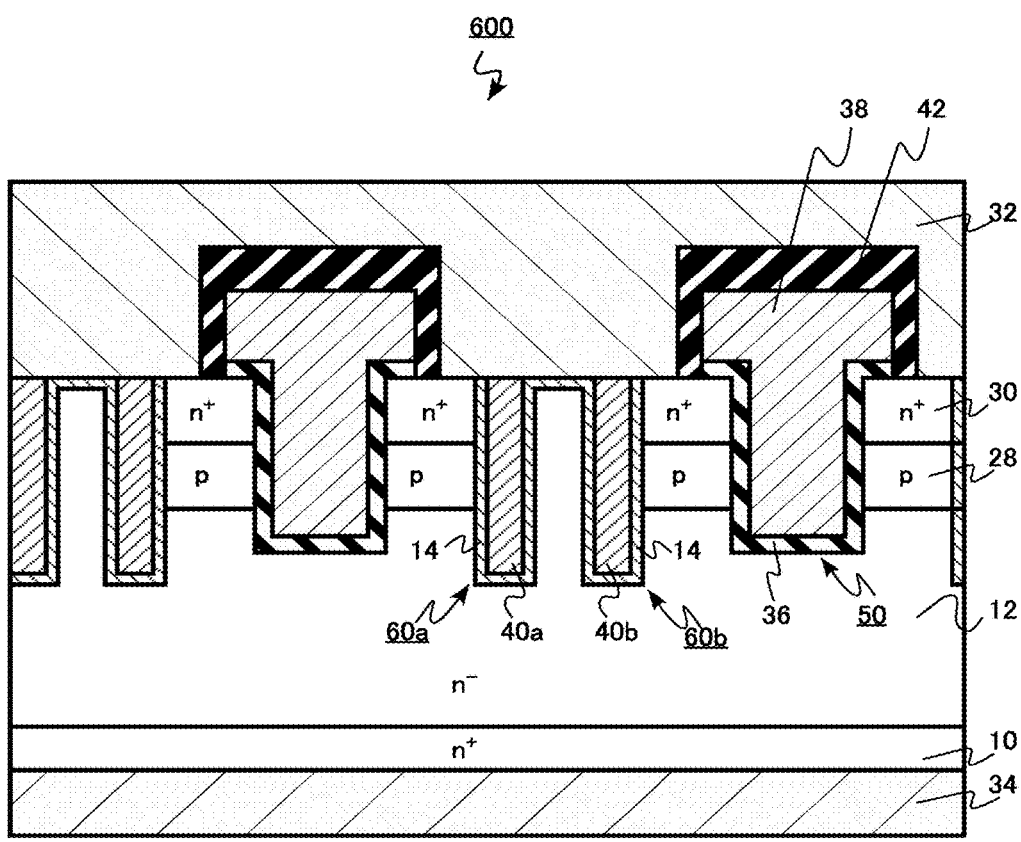
FIG. 17 is a cross-sectional view schematically illustrating a semiconductor device according to a sixth embodiment.

FIG. 17 is a cross-sectional view schematically illustrating the structure of a MOSFET 600 which is the semiconductor device according to this embodiment. The MOSFET 600 is a DIMOSFET. The MOSFET 600 is an n-type MOSFET having an electron as a carrier. The MOSFET 600 is a MOSFET having a trench gate structure in which a gate electrode is provided in a trench.

The MOSFET 600 includes an n+ SiC substrate 10, an n− drift region (a SiC region or a first SiC region) 12, an oxygen region (region) 14, a p-type well region 28, an n+ source region 30, a source electrode 32, a drain electrode (second electrode) 34, a gate insulating layer 36, a gate electrode 38, metal layers (electrodes or first electrodes) 40a and 40b, and an interlayer insulating layer 42. A first trench 50 and second trenches 60a and 60b are provided in the drift region 12.

The metal layer 40a is provided in the second trench 60a. The metal layer 40b is provided in the second trench 60b. The metal layers 40a and 40b have a greater work function than the source electrode 32.

The source electrode 32, the metal layers 40a and 40b, the drift region 12, the SiC substrate 10, and the drain electrode 34 form an SBD. The SBD has a structure having two types of Schottky barrier heights, that is, a low Schottky barrier between the source electrode 32 and the drift region 12 and a high Schottky barrier between the metal layers 40a and 40b and the drift region 12. The SBD is a so-called double Schottky diode. The SBD functions as a body diode (free wheeling diode) of the MOSFET 600.

When a voltage that is positive with respect to the drain electrode 34 is applied to the source electrode 32, the body diode is turned on and a current flows from the source electrode 32 to the drain electrode 34. In contrast, when the MOSFET 600 is turned on, that is, a voltage that is negative with respect to the drain electrode 34 is applied to the source electrode 32, the body diode is turned off. At that time, the interface between the source electrode 32 and the drift region 12 is covered by a depletion layer which extends from the metal layer 40a and the metal layer 40b. Therefore, the leakage current of the body diode is reduced.

For example, when the MOSFET 600 is applied as a switching device of an inverter, the double Schottky diode enables a large amount of return current to flow through the MOSFET 600.

In addition, since the double Schottky diode is used, a switching speed is higher than that of the PiN diode. The amount of leakage current when a reverse bias is applied is less than that in the Schottky barrier diode (SBD).

In the double Schottky diode, a trench electrode having a high Schottky barrier is formed so as to surround an electrode having a low Schottky barrier. The trench electrode can have various shapes such as a linear shape, a rectangular shape, and a hexagonal shape. In addition, a plurality of buried metal regions having a high Schottky barrier may be dispersed in a mesh shape.

Since the oxygen region 14 is provided in a portion of the drift region 12 immediately below the source electrode 32, Fermi level pinning is prevented and a double Schottky diode in which a variation in an on-voltage ($V_F$) is reduced is achieved. In addition, a double Schottky diode with high breakdown tolerance is achieved.

Since the oxygen region 14 is provided between the metal layers 40a and 40b and the drift region 12, the height of the Schottky barrier between the metal layers 40a and 40b and the drift region 12 is stabilized. Therefore, when a reverse bias is applied, a depletion layer is stably formed and the effect of reducing a leakage current is stabilized. In addition, when a reverse bias is applied, the amount of leakage current between the metal layers 40a and 40b and the drift region 12 can be reduced.

As described above, according to this embodiment, similarly to the fifth embodiment, the MOSFET 600 having low on-resistance is achieved. Since the height of the Schottky barrier between the metal layers 40a and 40b and the drift region 12 is stabilized, the MOSFET 600 with high reliability is achieved. In addition, the MOSFET 600 including a body diode with excellent characteristics is achieved.

Modification Example of Sixth Embodiment

A semiconductor device according to this modification example is the same as the semiconductor device according to the sixth embodiment except that it includes a p-type well contact region and a p-type anode region. Therefore, the description of the same content as that in the sixth embodiment will not be repeated.

Figure 18:
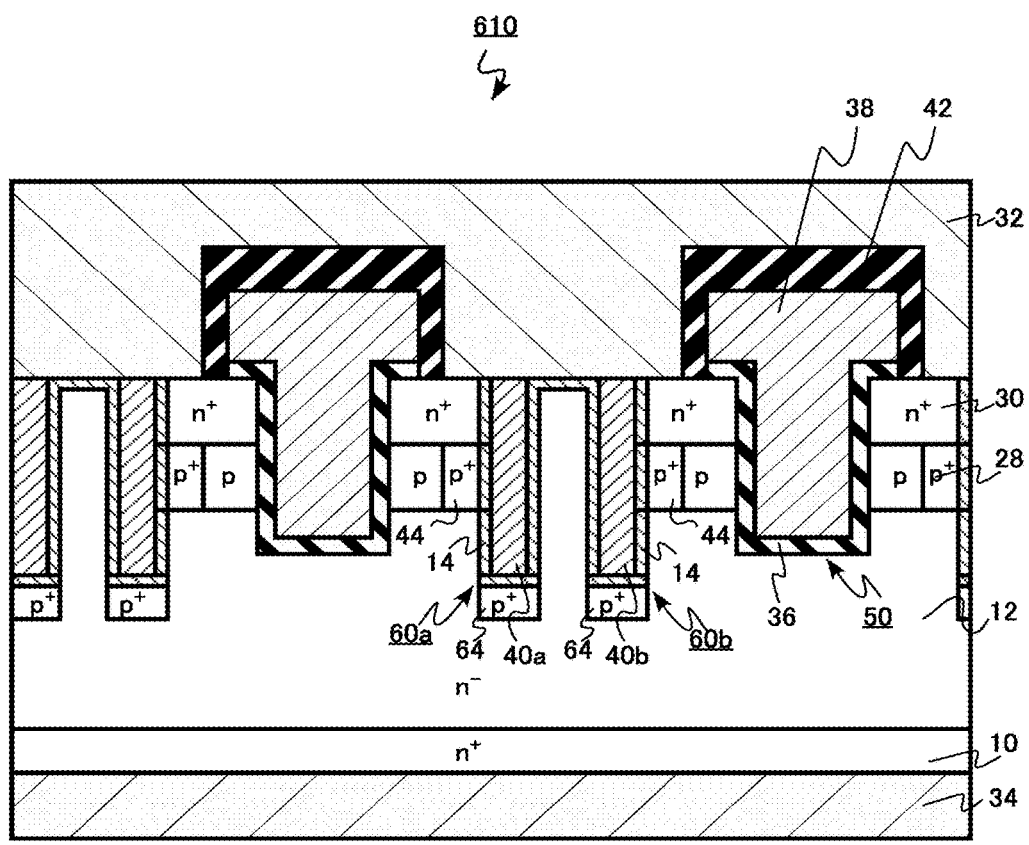
FIG. 18 is a cross-sectional view schematically illustrating a semiconductor device according to a modification example of the sixth embodiment.

FIG. 18 is a cross-sectional view schematically illustrating the structure of a MOSFET 610 which is the semiconductor device according to this modification example. The MOSFET 610 includes an $n^+$ SiC substrate 10, an $n^-$ drift region (a SiC region or a first SiC region) 12, an oxygen region (region) 14, a p-type well region 28, an $n^+$ source region 30, a $p^+$ well contact region 44, a $p^+$ anode region 64, a source electrode 32, a drain electrode (second electrode) 34, a gate insulating layer 36, a gate electrode 38, metal layers (electrodes or first electrodes) 40a and 40b, and an interlayer insulating layer 42. A first trench 50 and second trenches 60a and 60b are provided in the drift region 12.

The $p^+$ well contact region 44 is provided between the metal layers 40a and 40b and the well region 28. The well contact region 44 is a $p^+$ SiC region. The well contact region 44 includes, for example, Al as p-type impurities.

The p-type impurity concentration of the well contact region 44 is higher than the p-type impurity concentration of the well region 28. The p-type impurity concentration of the well contact region 44 is, for example, equal to or greater than $1 \times 10^{18}$ cm$^{-3}$ and equal to or less than $1 \times 10^{21}$ cm$^{-3}$.

The contact resistance between the well contact region 44 and the metal layers 40a and 40b is reduced by the well contact region 44. In particular, since the oxygen region 14 is disposed in the well contact region 44 so as to be close to the metal layers 40a and 40b, Fermi level pinning is prevented and the contact resistance is reduced. Therefore, a stable potential is applied to the well region 28 and the operation of the MOSFET 610 is stabilized.

The $p^+$ anode region 64 is provided between the metal layers 40a and 40b at the bottom of the second trenches 60a and 60b and the drift region 12. The anode region 64 is a $p^+$ SiC region.

The anode region 64 includes, for example, Al as p-type impurities. The p-type impurity concentration of the anode region 64 is, for example, equal to or greater than $1 \times 10^{18}$ cm$^{-3}$ and equal to or less than $1 \times 10^{21}$ cm$^{-3}$.

The anode region 64 causes a body diode to be an MPS diode. Therefore, the forward current of the body diode increases. A large amount of return current can flow. In addition, the electric field of the bottom of the first trench 50 is reduced by the expansion of a depletion layer from the anode region 64. Therefore, the breakdown of the gate insulating layer 36 is prevented.

As described above, according to this modification example, similarly to the sixth embodiment, the MOSFET 610 having low on-resistance is achieved. Since the height of the Schottky barrier between the metal layers 40a and 40b and the drift region 12 is stabilized, the MOSFET 610 with high reliability is achieved. In addition, the MOSFET 610 including a body diode with excellent characteristics is achieved. A stable potential is applied to the well region 28 and the operation of the MOSFET 610 is stabilized. Since the body diode is an MPS diode, a large amount of return current can flow.

Seventh Embodiment

A semiconductor device according to this embodiment is different from the semiconductor device according to the sixth embodiment in that it is a MOSFET with a planar structure. Therefore, the description of the same content as that in the sixth embodiment will not be repeated.

Figure 19:
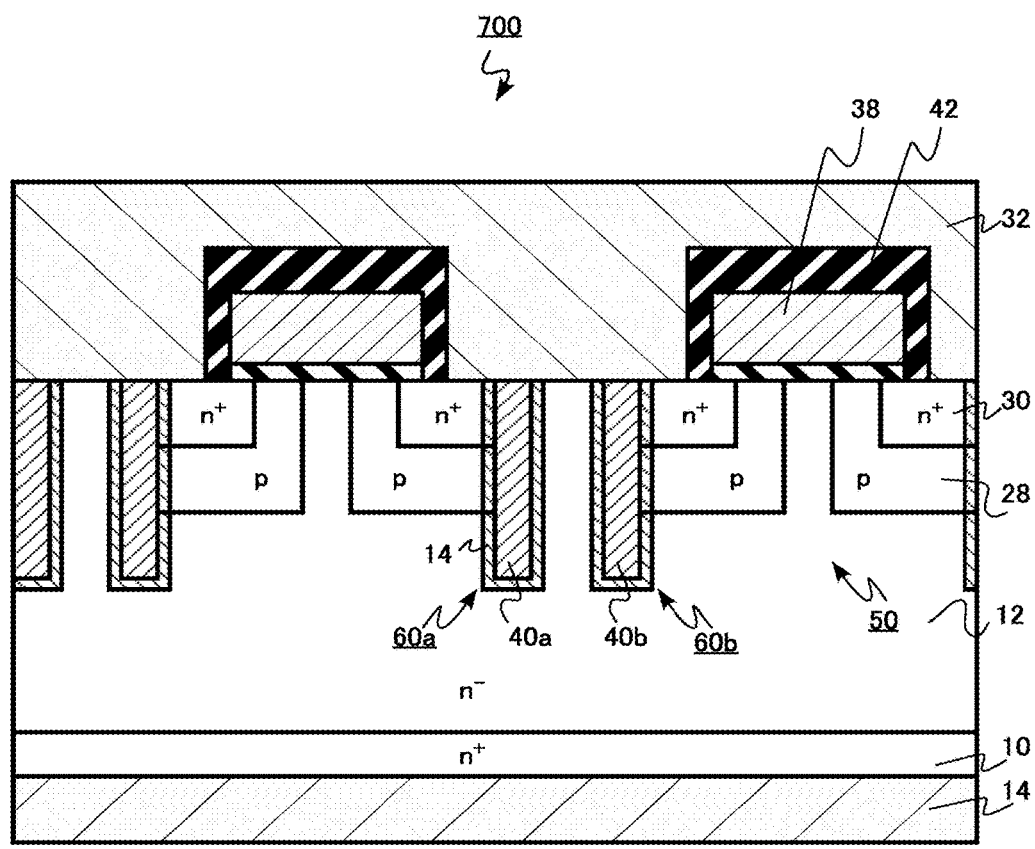
FIG. 19 is a cross-sectional view schematically illustrating a semiconductor device according to a seventh embodiment.

FIG. 19 is a cross-sectional view schematically illustrating the structure of a MOSFET 700 which is the semiconductor device according to this embodiment. The MOSFET 700 is a DIMOSFET. The MOSFET 700 is an n-type MOSFET having an electron as a carrier. The MOSFET 700 is a MOSFET having a planar structure.

The MOSFET 700 includes an $n^+$ SiC substrate 10, an $n^-$ drift region (a SiC region or a first SiC region) 12, an oxygen region (region) 14, a p-type well region 28, an $n^+$ source region 30, a source electrode 32, a drain electrode (second electrode) 34, a gate insulating layer 36, a gate electrode 38, metal layers (electrodes or first electrodes) 40a and 40b, and an interlayer insulating layer 42. Trenches 60a and 60b are provided in the drift region 12.

The metal layer 40a is provided in the second trench 60a. The metal layer 40b is provided in the second trench 60b. The metal layers 40a and 40b have a greater work function than the source electrode 32.

The source electrode 32, the metal layers 40a and 40b, the drift region 12, the SiC substrate 10, and the drain electrode 34 form an SBD. The SBD has two types of Schottky barrier heights, that is, a low Schottky barrier between the source electrode 32 and the drift region 12 and a high Schottky barrier between the metal layers 40a and 40b and the drift region 12. The SBD is a so-called double Schottky diode. The SBD functions as a body diode of the MOSFET 700.

As described above, according to this embodiment, similarly to the sixth embodiment, the MOSFET 700 having low on-resistance is achieved. Since the height of the Schottky barrier between the metal layers 40a and 40b and the drift region 12 is stabilized, the MOSFET 700 with high reliability is achieved. In addition, the MOSFET 700 including a body diode with excellent characteristics is achieved.

Modification Example of Seventh Embodiment

A semiconductor device according to this modification example is different from the semiconductor device according to the seventh embodiment in that a source region and a well region are provided between two trenches. Therefore, the description of the same content as that in the seventh embodiment will not be repeated.

Figure 20:
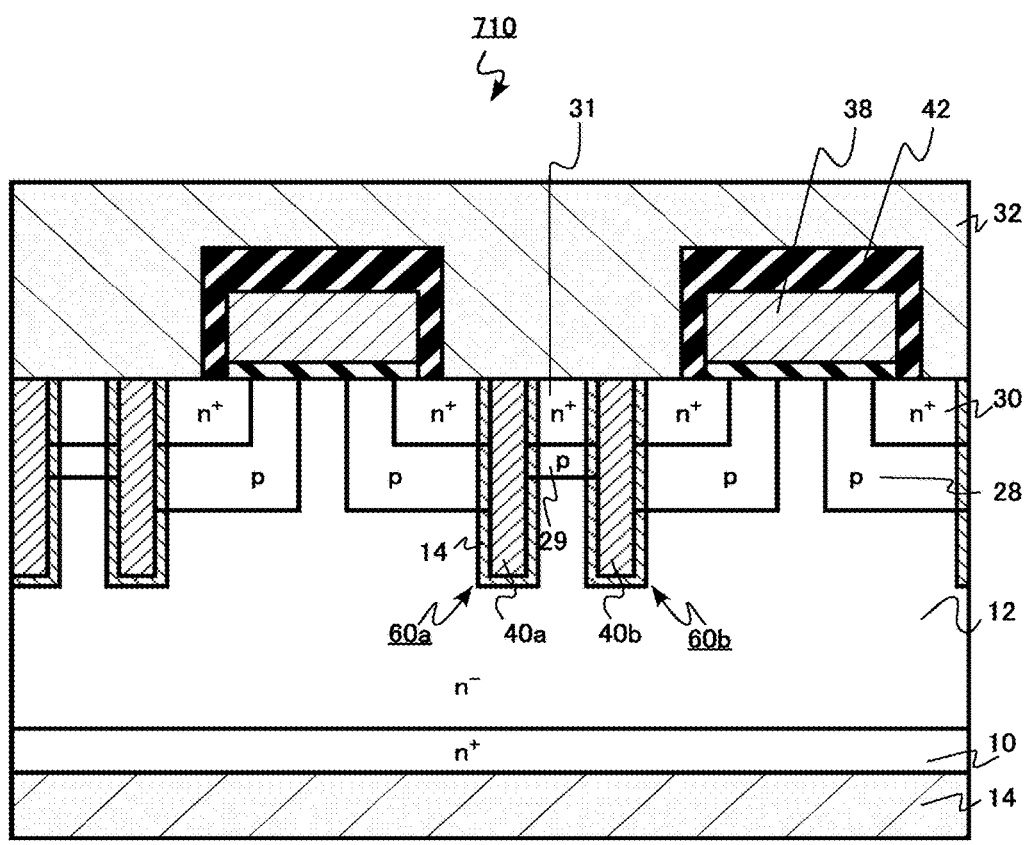
FIG. 20 is a cross-sectional view schematically illustrating a semiconductor device according to a modification example of the seventh embodiment.

FIG. 20 is a cross-sectional view schematically illustrating the structure of a MOSFET 710 which is the semiconductor device according to this modification example. The MOSFET 710 is a DIMOSFET. The MOSFET 710 is an n-type MOSFET having an electron as a carrier. The MOSFET 710 is a MOSFET having a planar structure.

The MOSFET 710 includes an n$^+$ SiC substrate 10, an n$^-$ drift region (a SiC region or a first SiC region) 12, an oxygen region (region) 14, a p-type well region 28, a p region 29, an n$^+$ source region 30, an n$^+$ region 31, a source electrode 32, a drain electrode (second electrode) 34, a gate insulating layer 36, a gate electrode 38, metal layers (electrodes or first electrodes) 40*a* and 40*b*, and an interlayer insulating layer 42. Trenches 60*a* and 60*b* are provided in the drift region 12.

The metal layer 40*a* is provided in the second trench 60*a*. The metal layer 40*b* is provided in the second trench 60*b*. The metal layers 40*a* and 40*b* have a greater work function than the source electrode 32.

The source electrode 32, the n$^+$ region 31, the metal layers 40*a* and 40*b*, the p region 29, the source region 30, the drift region 12, the SiC substrate 10, and the drain electrode 34 form a so-called transparent diode. This diode functions as a body diode of the MOSFET 710.

The contact resistance of the source electrode 32 can be sufficiently reduced by the n$^+$ region 31. For example, when the metal layers 40*a* and 40*b* are formed in a mesh shape, the n$^+$ region 31 can be connected to the source region 30 and it is possible to increase a contact area. In addition, a double Schottky diode having the mesh structure which can increase a contact area can be applied to a double trench structure.

The barrier of electrons can be controlled by the thickness of the p region 29. The p region 29 can be formed so as to be thinner than the well region 28 by, for example, the following method: when p-type impurity ions for forming the well region 28 are implanted, a resist is interposed between a region in which the p region 29 is to be formed and the well region 28.

Since the thickness of the p layer 29 is small, it is possible to reduce the rising voltage of the diode, that is, to reduce the threshold voltage of the diode. When the thickness of the p layer 29 is small, the threshold voltage is reduced, which makes it easy for electrons to pass. A reduction in the breakdown voltage is compensated for by the depletion of the metal layers 40*a* and 40*b*. That is, a double Schottky transparent diode is obtained.

As described above, according to this embodiment, similarly to the seventh embodiment, the MOSFET 710 having low on-resistance is achieved. Since the height of the Schottky barrier between the metal layers 40*a* and 40*b* and the drift region 12 is stabilized, the MOSFET 710 with high reliability is achieved. In addition, the MOSFET 710 including a body diode with excellent characteristics is achieved.

Eighth Embodiment

An inverter circuit and a driving device according to this embodiment include the semiconductor device according to the fifth embodiment.

Figure 21:
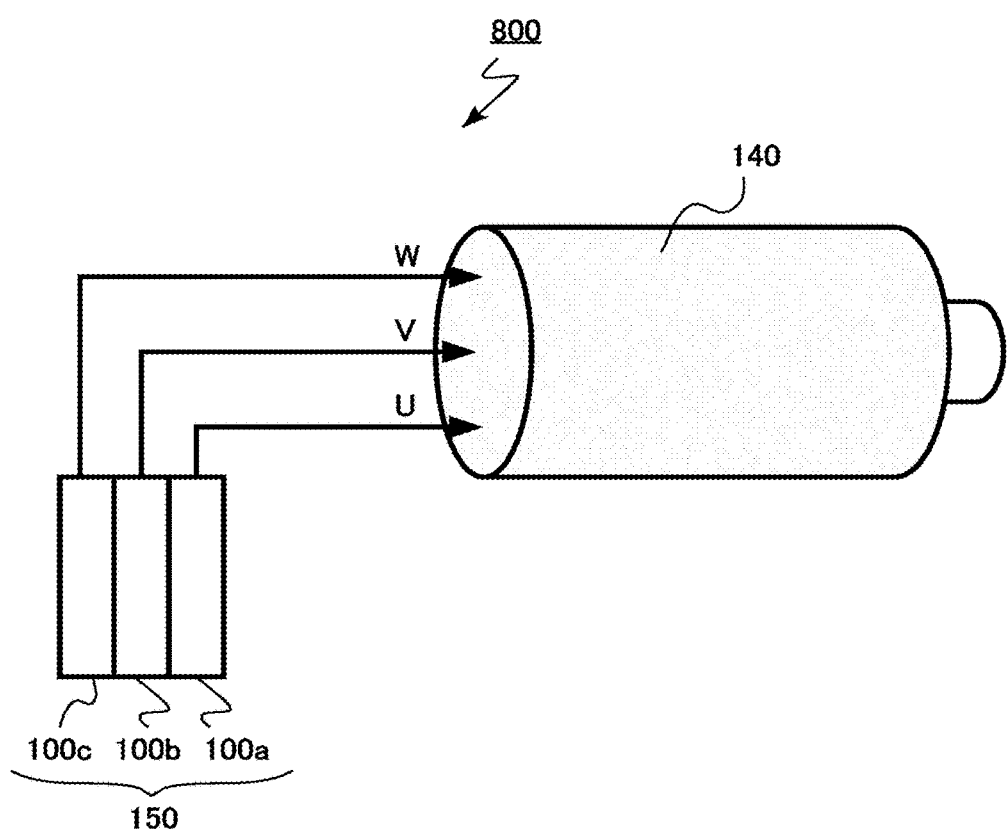
FIG. 21 is a diagram schematically illustrating a driving device according to an eighth embodiment.

FIG. 21 is a diagram schematically illustrating the driving device according to this embodiment. A driving device 800 includes a motor 140 and an inverter circuit 150.

The inverter circuit 150 includes three semiconductor modules 100*a*, 100*b*, and 100*c* each of which has the MOSFET 500 according to the fifth embodiment as a switching element. The three semiconductor modules 100*a*, 100*b*, and 100*c* are connected in parallel to each other to form a three-phase inverter circuit 150 having three AC voltage output terminals U, V, and W. The motor 140 is driven by an AC voltage which is output from the inverter circuit 150.

According to this embodiment, since a MOSFET with high reliability is provided, the reliability of the inverter circuit 150 and the driving device 800 is improved.

Ninth Embodiment

A vehicle according to this embodiment includes the semiconductor device according to the fifth embodiment.

Figure 22:
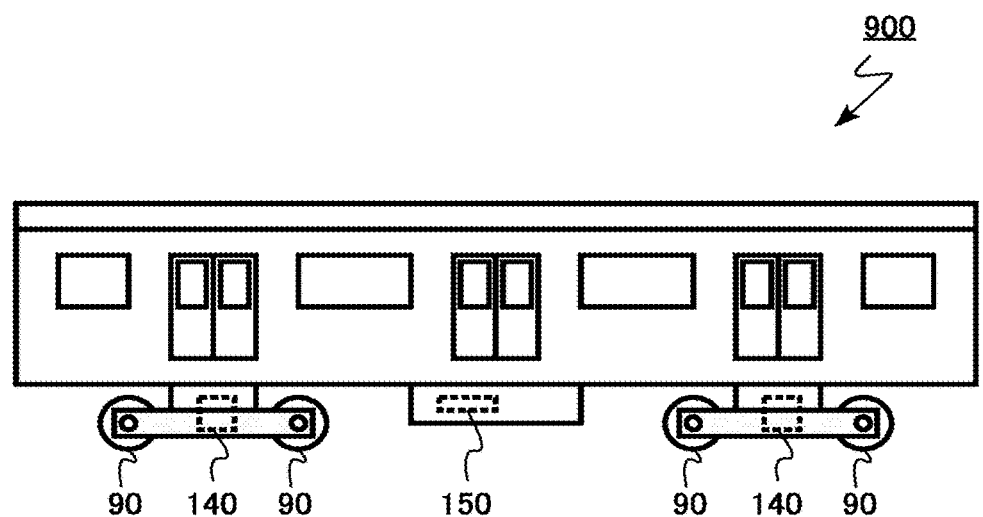
FIG. 22 is a diagram schematically illustrating a vehicle according to a ninth embodiment.

FIG. 22 is a diagram schematically illustrating the vehicle according to this embodiment. A vehicle 900 according to this embodiment is a railway vehicle. The vehicle 900 includes a motor 140 and an inverter circuit 150.

The inverter circuit 150 includes three semiconductor modules 100*a*, 100*b*, and 100*c* each of which has the MOSFET 500 according to the fifth embodiment as a switching element. The three semiconductor modules 100*a*, 100*b*, and 100*c* are connected in parallel to each other to form a three-phase inverter circuit 150 having three AC voltage output terminals U, V, and W.

The motor 140 is driven by an AC voltage which is output from the inverter circuit 150. Wheels 90 of the vehicle 900 are driven by the motor 140.

According to this embodiment, since a MOSFET with high reliability is provided, the reliability of the vehicle 900 is improved.

Tenth Embodiment

A vehicle according to this embodiment includes the semiconductor device according to the fifth embodiment.

Figure 23:
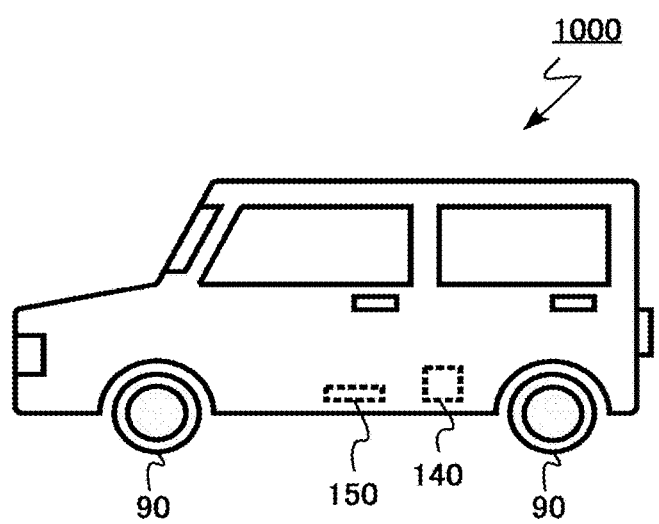
FIG. 23 is a diagram schematically illustrating a vehicle according to a tenth embodiment.

FIG. 23 is a diagram schematically illustrating the vehicle according to this embodiment. A vehicle 1000 according to this embodiment is a car. The vehicle 1000 includes a motor 140 and an inverter circuit 150.

The inverter circuit 150 includes three semiconductor modules 100*a*, 100*b*, and 100*c* each of which has the MOSFET 500 according to the fifth embodiment as a switching element. The three semiconductor modules 100*a*, 100*b*, and 100*c* are connected in parallel to each other to form a three-phase inverter circuit 150 having three AC voltage output terminals U, V, and W.

The motor 140 is driven by an AC voltage which is output from the inverter circuit 150. Wheels 90 of the vehicle 1000 are driven by the motor 140.

According to this embodiment, since a MOSFET with high reliability is provided, the reliability of the vehicle 1000 is improved.

Eleventh Embodiment

An elevator according to this embodiment includes the semiconductor device according to the fifth embodiment.

Figure 24:
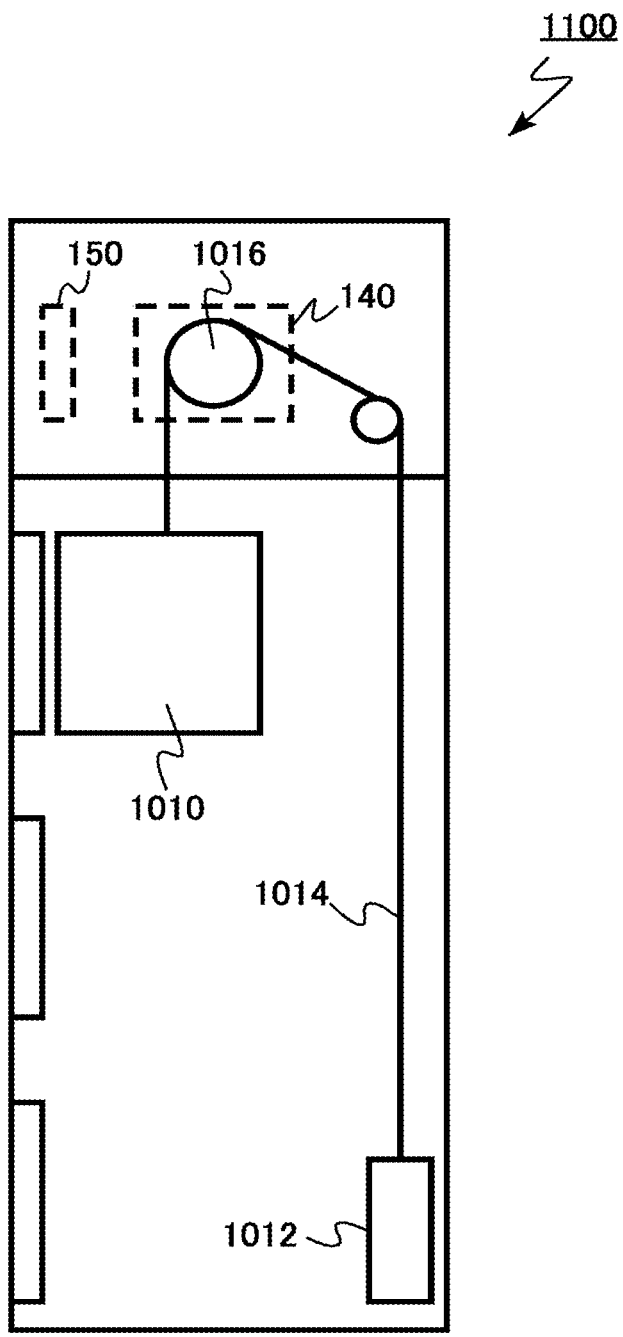
FIG. 24 is a diagram schematically illustrating an elevator according to an eleventh embodiment.

FIG. 24 is a diagram schematically illustrating the elevator according to this embodiment. An elevator 1100 according to this embodiment includes a basket 1010, a counter weight 1012, a wire rope 1014, a hoist 1016, a motor 140, and an inverter circuit 150.

The inverter circuit 150 includes three semiconductor modules 100*a*, 100*b*, and 100*c* each of which has the MOSFET 500 according to the fifth embodiment as a switching element. The three semiconductor modules 100*a*, 100b, and 100c are connected in parallel to each other to form a three-phase inverter circuit 150 having three AC voltage output terminals U, V, and W.

The motor 140 is driven by an AC voltage which is output from the inverter circuit 150. The hoist 1016 is rotated by the motor 140 to move up and down the basket 1010.

According to this embodiment, since a MOSFET with high reliability is provided, the reliability of the elevator 1100 is improved.

In the first to seventh embodiments and the modification examples thereof, an example in which the crystal structure of silicon carbonate (SiC) is 4H—SiC has been described above. However, the invention can be applied to silicon carbonate with other crystal structures such as 6H—SiC and 3C—SiC. In addition, a case in which an electrode is formed on the Si face has been mainly described above. However, the invention can also be applied to a case in which a contact electrode is formed on the c-face, the a-face, the m-face, or an intermediate face therebetween.

In the first to seventh embodiments and the modification examples thereof, a diode and a MOSFET are given as an example of the semiconductor device. However, the invention can be applied to, for example, an n-type SiC region and an electrode provided on the n-type SiC region in a metal insulator semiconductor field effect transistor (MISFET) or an insulated gate bipolar transistor (IGBT).

In the first to seventh embodiments and the modification examples thereof, it is preferable that the n-type impurity be, for example, nitrogen (N) or phosphorus (P). However, the n-type impurity may be, for example, arsenic (As) or antimony (Sb). It is preferable that the p-type impurity be, for example, aluminum (Al). However, the p-type impurity may be, for example, boron (B), gallium (Ga), or indium (In).

While certain embodiments have been described, these embodiments have been presented by way of example only, and are not intended to limit the scope of the inventions. Indeed, the semiconductor device, the semiconductor device manufacturing method, the inverter circuit, the driving device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
an n-type SiC region;
an electrode in contact with the n-type SiC region; and
a region including oxygen, the region provided in the n-type SiC region, the region being provided adjacent to the electrode, the region being SiC.

2. The device according to claim 1,
wherein an oxygen concentration of the region is equal to or greater than $1\times10^{16}$ cm$^{-3}$ and equal to or less than $1\times10^{21}$ cm$^{-3}$.

3. The device according to claim 1,
wherein the electrode includes metal.

4. The device according to claim 3,
wherein the metal is nickel (Ni), titanium (Ti), or molybdenum (Mo).

5. The device according to claim 1,
wherein a distance between the electrode and a position of a vertex of a peak of a concentration distribution of oxygen in the region is equal to or less than 10 nm.

6. The device according to claim 1,
wherein a full width at half maximum of a peak of a concentration distribution of oxygen in the region is equal to or less than 10 nm.

7. The device according to claim 1,
wherein a Si—O—Si bond is present in the region.

8. The device according to claim 1,
wherein the region includes a pair of oxygen positioned in a carbon site of SiC lattice.

9. The device according to claim 1,
wherein an n-type impurity concentration of the n-type SiC region is equal to or greater than $1\times10^{15}$ cm$^{-3}$ and equal to or less than $1\times10^{18}$ cm$^{-3}$.

10. An inverter circuit comprising:
the semiconductor device according to claim 1.

11. A driving device comprising:
the semiconductor device according to claim 1.

12. A vehicle comprising:
the semiconductor device according to claim 1.

13. An elevator comprising:
the semiconductor device according to claim 1.

* * * * *